(12) United States Patent
Tsuji et al.

(10) Patent No.: US 7,212,977 B2
(45) Date of Patent: May 1, 2007

(54) MANAGING APPARATUS AND MANAGING METHOD OF A SEMICONDUCTOR MANUFACTURING APPARATUS

(75) Inventors: Akitoshi Tsuji, Nirasaki (JP); Osamu Suenaga, Nirasaki (JP); Kiyoshi Komiyama, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 1133 days.

(21) Appl. No.: 09/886,475

(22) Filed: Jun. 22, 2001

(65) Prior Publication Data

US 2003/0065471 A1    Apr. 3, 2003

Related U.S. Application Data

(63) Continuation of application No. PCT/JP01/04318, filed on May 23, 2001.

(30) Foreign Application Priority Data

May 24, 2000    (JP)    ............................. 2000-153152

(51) Int. Cl.
    *G06Q 99/00*    (2006.01)
(52) U.S. Cl. ................................ 705/1; 705/7; 204/602
(58) Field of Classification Search .................... None
    See application file for complete search history.

(56) References Cited

U.S. PATENT DOCUMENTS 3,961,895 A * 6/1976 Frenyo ..................... 436/133
5,058,491 A  10/1991 Wiemer et al.
5,249,120 A * 9/1993 Foley ........................... 705/1

(Continued)

FOREIGN PATENT DOCUMENTS

EP    1296359 A1 *  3/2003

(Continued)

OTHER PUBLICATIONS

Environmentally Conscious Design and Manufacturing: A state-of-the-art survey by Zhang et al., 1997, Journal of Manufacturing Systems, v16n5, pp. 352-371, entire document as provided.*

*Primary Examiner*—John G. Weiss
*Assistant Examiner*—Michael Fisher
(74) *Attorney, Agent, or Firm*—Pillsbury Winthrop Shaw Pittman, LLP

(57) ABSTRACT

Power consumption of electric equipment used in a semiconductor manufacturing apparatus (100) is obtained and the total amount is displayed as calories by a display means. The semiconductor manufacturing apparatus is configured so that the equipment is set up inside a housing (10). The amount of heat discharged from the inside to the outside (a clean room) via the housing is obtained, and further, the amount of heat removed by exhaust from the interior of the housing and the amount of heat removed by cooling water that cools the equipment is also obtained, and the total amount of heat is displayed. Additionally, factors pertaining to operating costs such as power consumption are measured and their cost obtained, the amount of power consumed is multiplied by a crude oil conversion coefficient to obtain the amount of $CO_2$ generated, and the result is displayed. The factors to be measured are measured by a thermocouple, an anemometer and an power meter, and the measurements are input to a personal computer (6) via a conversion module (7).

32 Claims, 15 Drawing Sheets

U.S. PATENT DOCUMENTS

| | | | |
|---|---|---|---|
| 5,801,961 A | 9/1998 | Moore et al. | |
| 5,970,476 A | 10/1999 | Fahey | |
| 6,324,527 B1 * | 11/2001 | Bajuk et al. | 705/400 |
| 6,355,874 B1 * | 3/2002 | Yagi et al. | 136/252 |

FOREIGN PATENT DOCUMENTS

| | | |
|---|---|---|
| JP | 03-263 541 | 11/1991 |
| JP | 09-056 068 | 2/1997 |
| JP | 9-91254 | 4/1997 |
| JP | 10-115 481 | 5/1998 |
| JP | 11-184 566 | 7/1999 |
| JP | 11-200651 | 7/1999 |
| JP | 11-206 488 | 10/1999 |

* cited by examiner

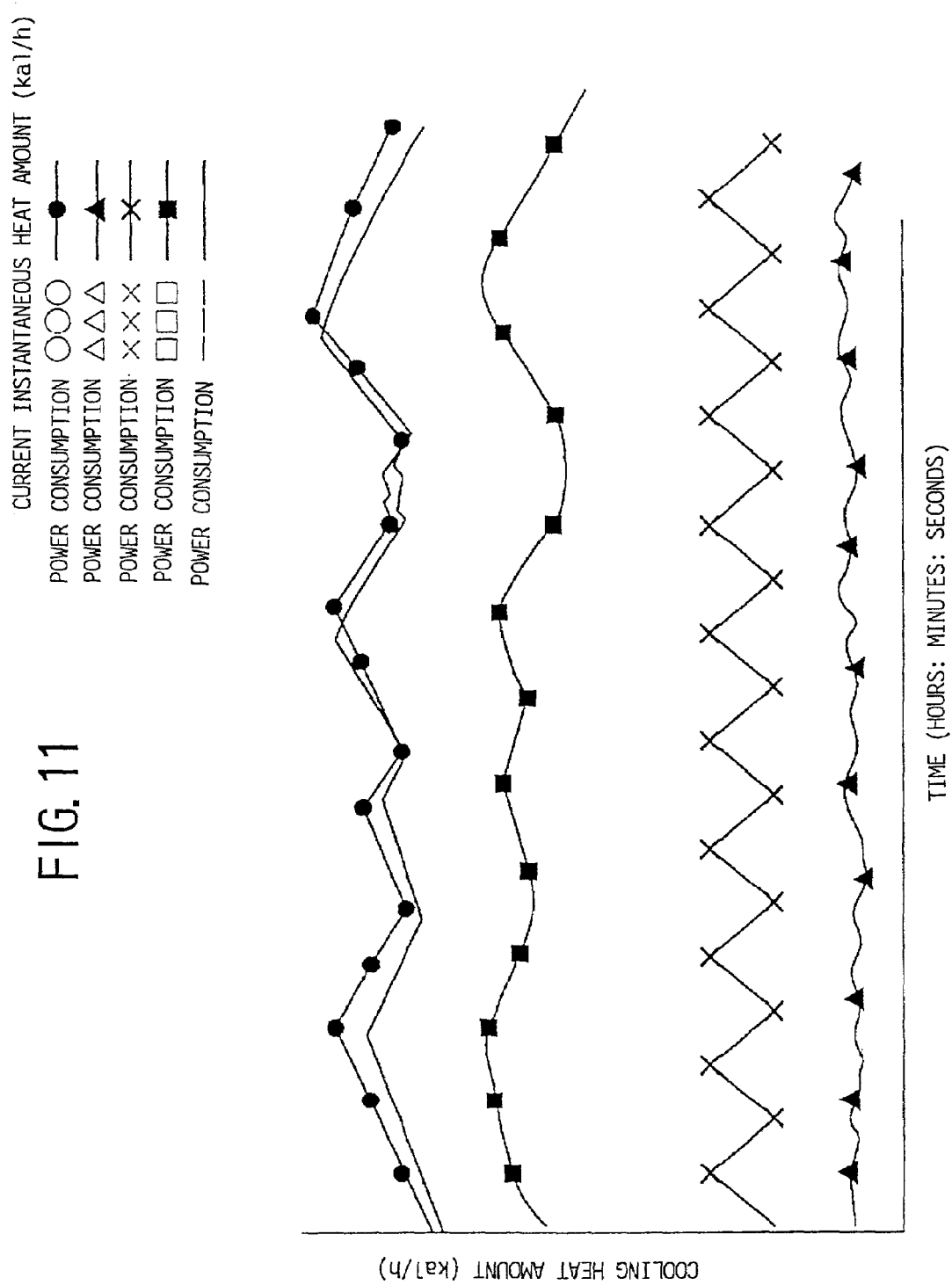

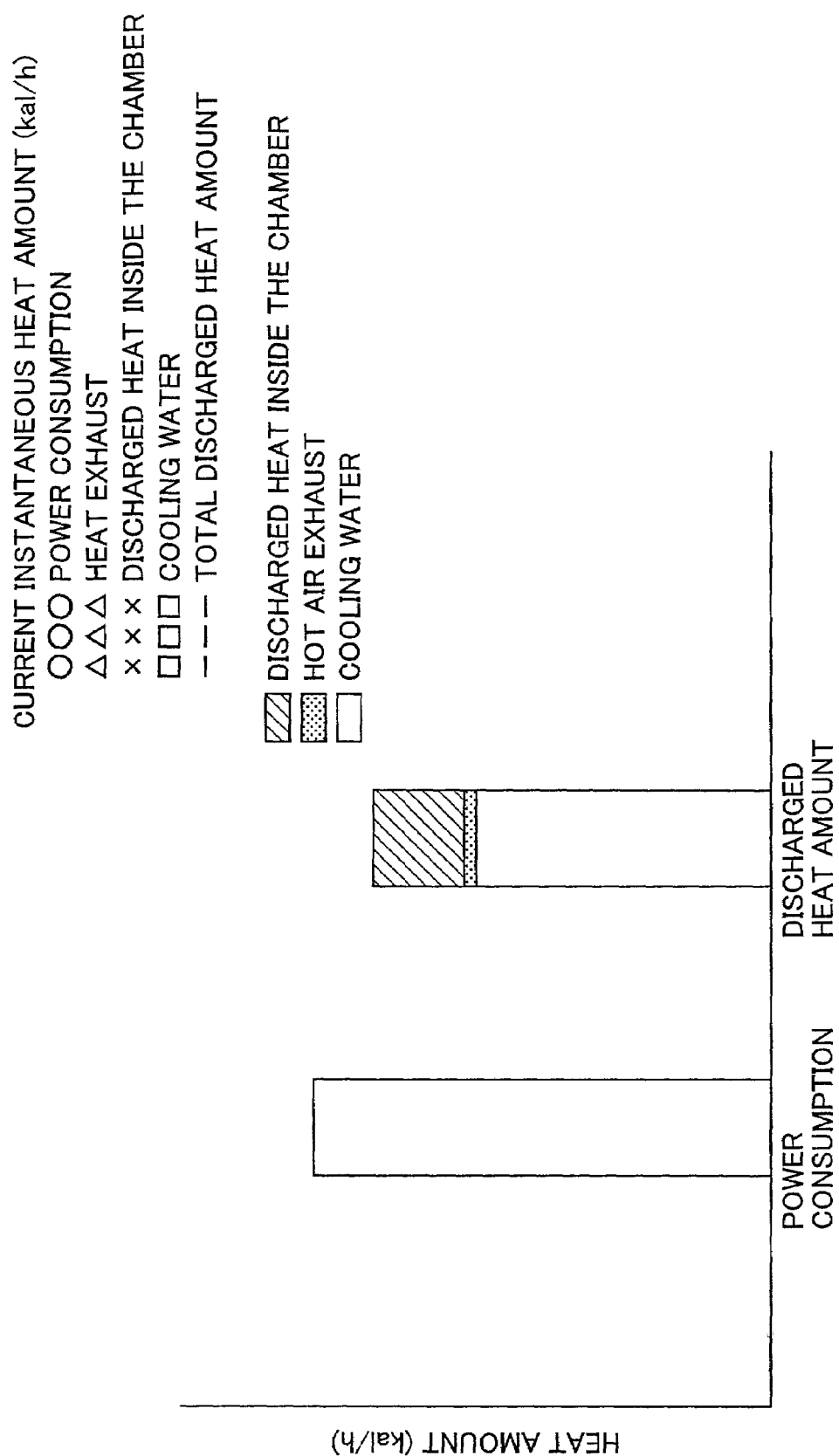

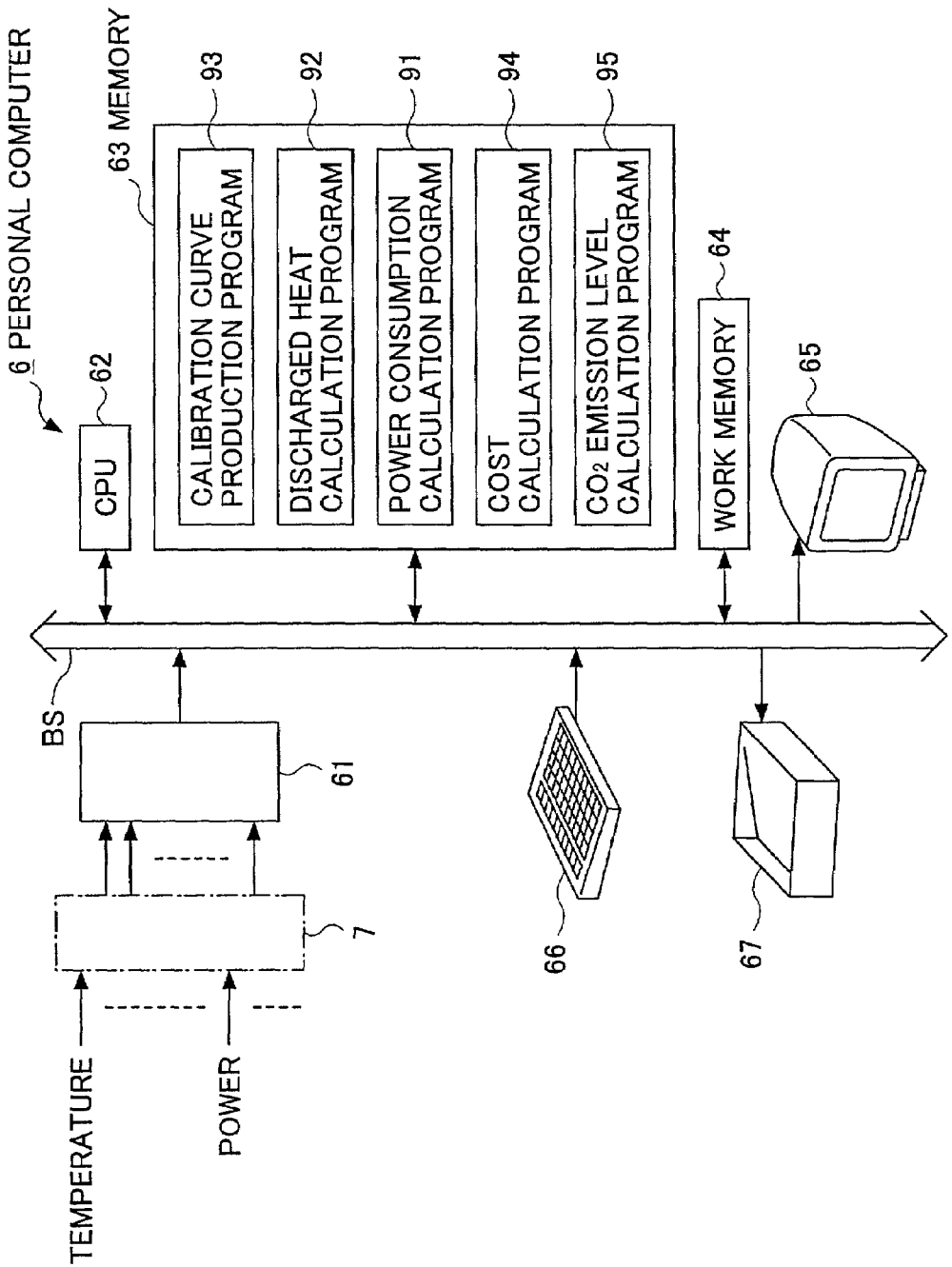

MANAGING APPARATUS AND MANAGING METHOD OF A SEMICONDUCTOR MANUFACTURING APPARATUS

This is a International Application No. PCT/JP01/04318 filed May 23, 2001 which designated the U.S.

TECHNICAL FIELD

The present invention relates to a managing apparatus and managing method of a semiconductor manufacturing apparatus, and more particularly, to a managing apparatus and managing method of a semiconductor manufacturing apparatus that is capable of tracking the amount of heat supplied to the semiconductor manufacturing apparatus and the amount of heat discharged from the apparatus, and is further capable of tracking the operating costs and $CO_2$ emission levels of such apparatuses on a per-unit basis.

BACKGROUND ART

As a host of environmental issues, such as global warming and the destruction of the ozone layer, continue to be talked about, industry, too has seen advances in energy efficiency through reduction in energy consumption. A large number of efforts are under way aimed at harmonizing industry and the environment, though at present no fundamental resolution of the problem has been put forward. In addition to this backdrop, reductions in energy consumption and in costs are major concerns because semiconductor manufacturing apparatuses such as heat treatment apparatuses as well as resist coating and development apparatuses consume large amounts of energy, and the clean rooms in which such apparatuses are operated are themselves costly environments. In semiconductor manufacturing plants, for example, the amount of energy consumed is tracked and managed using power meters for each semiconductor manufacturing apparatus on an individual (unit) basis.

When electric power is supplied to a semiconductor manufacturing apparatus and the equipment is activated, inevitably heat escapes through the walls of the equipment to the outside. However, if that heat is left as is, then the temperature inside the clean room will rise. At the same time, the temperature inside the clean room must be maintained at a constant temperature, such as for example 23° C., so the heat discharged from the equipment must be removed from the clean room. For this reason, the equipment is cooled by the flow of cooling water and/or the interior of a housing enclosing the equipment is ventilated.

However, even with such measures heat is discharged into the clean room via the housing, and that heat becomes part of the burden on the clean room temperature control system. That is, viewing the semiconductor manufacturing plant as a whole, processing the heat discharged from the equipment also consumes energy, and imposes corresponding costs. Therefore it follows that, even if it is possible to save energy on an individual equipment basis, then no energy savings can be realized for the semiconductor manufacturing plant as a whole if the amount of energy consumed in processing the heat discharged from the equipment is large.

Accordingly, in order to carry out optimum management of the plant as a whole including energy consumption and costs, it is necessary to track and to integrally manage the amount of energy consumed by the equipment as a whole, including the amount of heat discharged. Further, given that efforts to reduce emissions of $CO_2$ (carbon dioxide) must be undertaken on a global scale, the amount of $CO_2$ generated must be managed as well.

DISCLOSURE OF THE INVENTION

The present invention has as its overall object to provide an improved managing apparatus and managing method of a semiconductor manufacturing apparatus that solve the above-described problems.

A more specific object of the present invention is to provide a managing apparatus capable of tracking energy consumption of the equipment as a whole and conducting integrated systems management including the amount of heat discharged.

Another object of the present invention is to provide a managing apparatus capable of managing emissions of $CO_2$ (carbon dioxide).

In order to achieve these objects, according to one aspect of the present invention, there is provided a managing apparatus of a semiconductor manufacturing apparatus, comprising power measuring means for measuring electrical power consumption of electrical equipment used in the semiconductor manufacturing apparatus; utility measuring means for measuring an amount of a utility fluid manufactured or processed; means for obtaining an amount of electric power consumed when manufacturing or processing the fluid based on values measured by the utility measuring means; energy consumption calculating means for adding together the electrical power consumption of the electrical equipment and the amount of electric power consumed when manufacturing or processing the fluid and obtaining energy consumption of the apparatuses used in semiconductor manufacturing on a per-unit basis; factor measuring means for measuring factors needed to obtain the amount of heat discharged from the equipment used in the apparatus used in semiconductor manufacturing; discharged heat amount calculating means for obtaining an amount of heat discharged on a per unit basis from the apparatus used in the semiconductor manufacturing based on values measured by the factor measuring means; and display means for displaying the amount of heat discharged as obtained by the discharged heat calculating means and displaying the energy consumption as obtained by the energy consumption calculating means.

In the above-described invention, the apparatus used in semiconductor manufacturing is not limited to the semiconductor manufacturing apparatus itself, such as a vertical heat treatment device and a resist coating device, but also includes semiconductor manufacturing apparatus accessory equipment such as, for example, exhaust gas treatment devices and pumps or chillers for removing certain components from the exhaust gas exhausted from the semiconductor manufacturing apparatus. Additionally, the fluid that is a utility may correspond for example to a temperature control fluid for controlling the temperature of the equipment, for example a cooling fluid or a heating fluid. Or, such may correspond to air that is circulated inside the apparatus used in semiconductor manufacturing, for example air that is supplied to an interior of a housing if the apparatus itself is enclosed within a housing, or to water or gas used by the apparatus used in semiconductor manufacturing.

In an embodiment of the present invention, the apparatus used in semiconductor manufacturing includes equipment contained within a housing, an exhaust system that exhausts an inside of the housing and removes heat inside the housing to outside a clean room, and equipment that is cooled by a cooling fluid that flows along a flow path, with discharged heat including an amount of heat discharged Q1 from the equipment contained within the housing to the clean room via the inside of the housing, an amount of heat Q2 removed from the exhaust system by an exhaust gas, and an amount of heat Q3 removed by the cooling fluid.

As a more specific composition of the present invention, it is possible to have a configuration comprising a computer (calculator) including a discharged heat amount calculating means, a consumption energy calculating means and a display means, and a signal converter for converting measurement results of the factor measuring means into signals that can be processed by a computer. In this case, it is preferable to make these into a mobile system mounted on a cart, so that it is possible to go around each apparatus and measure a heat budget.

According to this type of invention, it is possible to track the heat budget for an apparatus used in semiconductor manufacturing, obtain a guide to the optimal utilization of the system, and for example obtain clues to a heat emission reduction regime and discover the major causes of heat generation.

Further, the present invention can comprise operating cost measuring means for measuring measurement items related to an operating cost of the apparatus used in semiconductor manufacturing; and means for calculating a cost conversion factor from measurement results from the operating cost measuring means and the values corresponding to the measurement items and obtaining a sum total of the results of the calculation as a per-unit cost of the apparatus used in the semiconductor manufacturing, the managing apparatus displaying the per-unit operating costs of the apparatus used in the semiconductor manufacturing at the display means. As measurement items it is possible to use measurements measured when obtaining the heat budget.

Further and additionally, the present invention can be a managing apparatus configured to comprise carbon dioxide emission measuring means for measuring measurement items relating to carbon dioxide emissions calculated for the apparatuses used in semiconductor manufacturing; and means for calculating measurement results from the carbon dioxide emission measuring means and a carbon dioxide emission conversion factor corresponding to those measurement items, and obtaining a sum of a result of a calculation as a per-unit carbon dioxide emission level for the apparatus used in the semiconductor manufacturing, displaying the per-unit carbon dioxide emission level for the apparatus used in the semiconductor manufacturing so obtained at the display means.

Tracking these types of costs and carbon dioxide emission levels has the effect of optimizing utilization of the system and reducing the burden on the environment, including reducing system energy consumption.

Additionally, the present invention is also formed for a managing method for a semiconductor manufacturing apparatus, comprising the steps of measuring power consumption of electrical equipment used in the semiconductor manufacturing apparatus; measuring an amount of a fluid that is a utility that is manufactured or processed and obtaining an amount of power consumed when manufacturing or processing the fluid based on the measured value; adding the electrical equipment power consumption and the amount of power consumed when manufacturing or processing the fluid based on the measured value and obtaining energy consumption on a per-unit basis for the apparatus used in the semiconductor manufacturing; measuring factors needed to obtain an amount of heat discharged from the equipment used in the semiconductor manufacturing apparatus and obtaining an amount of heat discharged on a per-unit basis for the semiconductor manufacturing apparatus based on the measurements; and displaying the energy consumption and the amount of heat discharged on a per-unit basis for the semiconductor manufacturing apparatus.

Other objects, features and advantages of the present invention will become more apparent from the following detailed description with reference to the accompanying drawings.

BRIEF DESCRIPTION OF THE DRAWINGS

FIG. 11 is a graph showing sample changes with time of heat budgets and amount of heat discharged when operating the vertical heat treatment apparatus.

FIG. 12 is a graph showing sample changes with time of heat budgets and amount of heat discharged when operating the vertical heat treatment apparatus.

FIG. 13 is a schematic diagram showing a configuration of a personal computer used in a second embodiment of the present invention.

BEST MODE OF CARRYING OUT THE INVENTION

Figure 1:
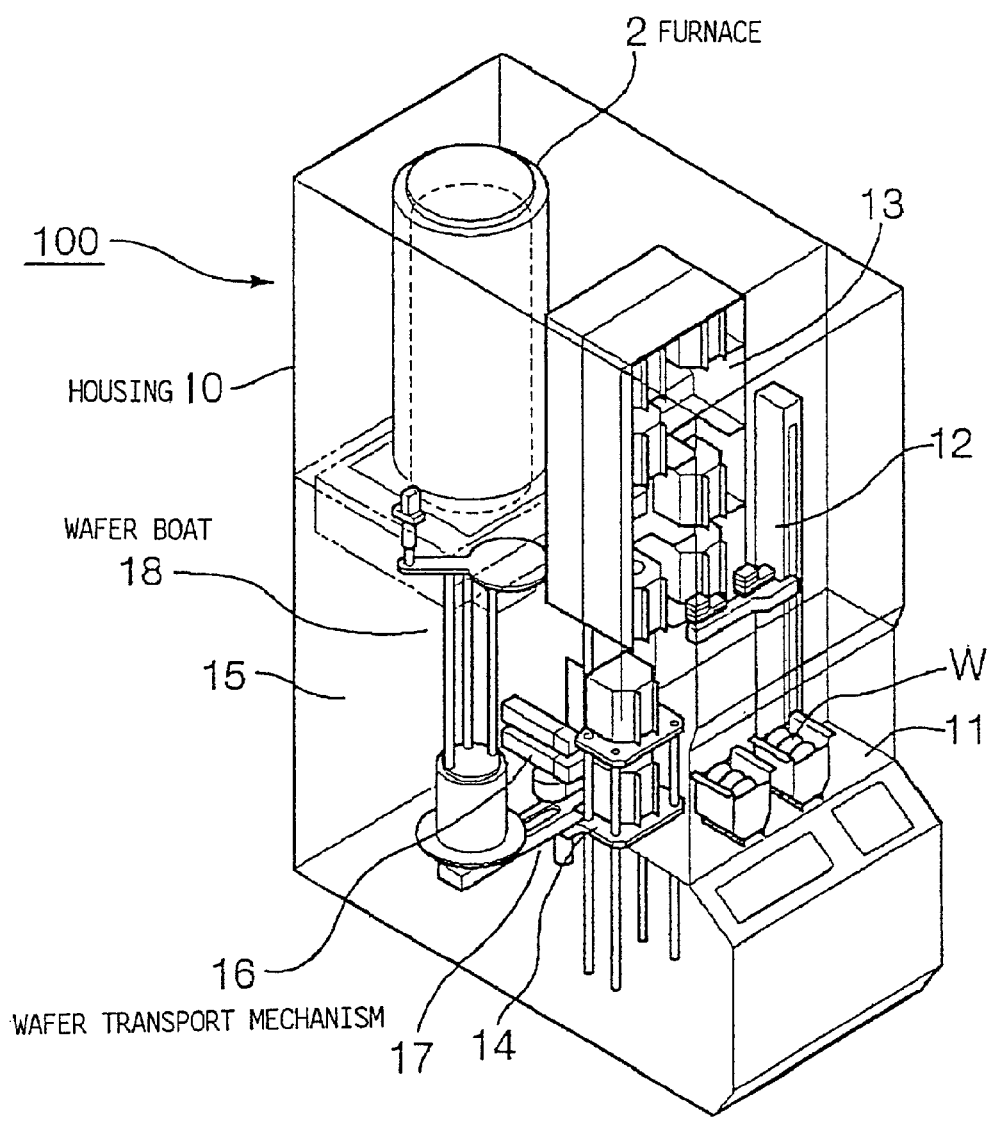
FIG. 1 is a perspective view of a vertical heat treatment apparatus managed by a managing apparatus according to an embodiment of the present invention.

A description will now be given of embodiments of the present invention, with reference to the drawings. It should be noted that, in the drawings, identical compositional elements are given identical reference numbers. It should be noted that the embodiments described below are described using the example of a vertical heat treatment apparatus as the apparatus used in semiconductor manufacturing.

(First Embodiment)

The apparatus according to the first embodiment of the present invention is an apparatus for measuring power consumption (that is, energy consumption) and an amount of heat discharged and tracking a heat budget for the vertical heat treatment apparatus on a per-unit basis.

First, a description will be given of the vertical heat treatment apparatus with reference to FIG. 1 and FIG. 2. In FIG. 1, 10 is a housing that constitutes an exterior of the apparatus, 11 is a carrier access port, 12 is a carrier transport mechanism, 13 is a carrier stocker and 14 is a delivery stage. A carrier C containing a semiconductor wafer W is delivered to the access port 11, and, after being temporarily stored by the carrier transport mechanism in the carrier stocker 13, is transported to the delivery stage 14. Thereafter a wafer is removed from inside the carrier C atop the delivery stage 14 by a wafer transport mechanism 16 inside a wafer loader chamber 15. The wafer is then loaded aboard a wafer boat 18 that is a wafer holder positioned atop a boat elevator 17. The wafer boat 18 is then raised by the boat elevator 17 and put into the furnace 2.

Figure 2:
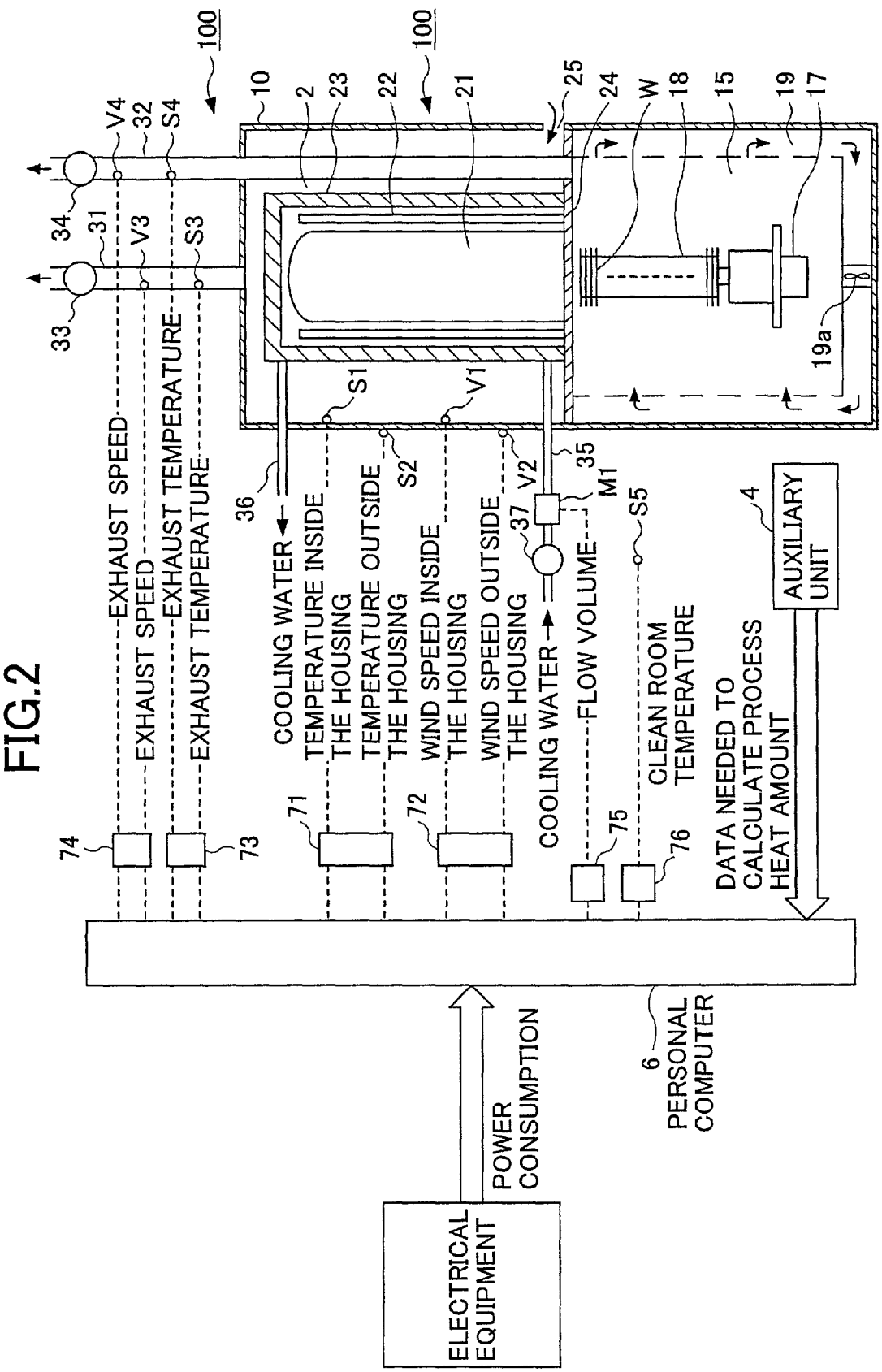
FIG. 2 is a diagram illustrating an entire structure of a management system according to a first embodiment of the present invention.

As shown in FIG. 2, the furnace 2 is composed of a quartz reaction tube 21 open at a bottom, a heater 22 positioned so as to surround a periphery of the reaction tube 21, and a heat insulator 23 provided so as to surround the heater 22. A horizontal partition panel 24 is provided between an upper part and a lower part of the housing 11, with the furnace 2 being supported by this partition panel 24. The partition panel 24 separates the wafer loader chamber 15 from space on an outside of the furnace 2. An exhaust duct 31 that is a first exhaust system for the purpose of exhausting warm air from the area above the partition plane 24 is connected to a top surface of the housing 10. Air is taken into the area above the partition panel 24 through an air intake port 25 provided on the housing 10.

An exhaust duct 32 that is a second exhaust system is inserted from the top surface of the housing 10, a bottom end of which passes through the partition plane 24 and opens into the wafer loader chamber 15. The air inside the wafer loader chamber 115 is thus exhausted via the exhaust duct 32. The exhaust ducts 31, 32 reach to a ceiling of the clean room, through the ceiling and to an exhaust system inside the factory. Exhausting of the exhaust duct 31, 32 is for example performed by an exhaust effect of an exhaust fan inside the factory, but for convenience of description exhaust fans 33, 34 are provided on the exhaust ducts 31, 32 respectively.

It should be noted that an air circulation system 19 is formed in the walls and floor of the wafer loader chamber 15, and the air inside the wafer loader chamber 15 is circulated by a circulation fan 19a.

Additionally, a coil-shaped flow path (not shown in the diagram) for a temperature control fluid such as cooling water for the purpose of removing heat discharged from inside the furnace 2 is provided on an exterior periphery of the furnace 2. The cooling water is exhausted from a pipe 35 via the flow path to a pipe 36. The expelled cooling water is cooled to a predetermined temperature by a cooling system to be described later and then circulated. The cooling water is circulated by a water supply pump 37. A difference between a temperature of the cooling water on the intake side of the furnace 2 (that is, a temperature inside the pipe 35) and a temperature of the cooling water on the exhaust side of the furnace 2 (that is, a temperature inside the pipe 36 is set to be for example approximately 5° C.

A main unit 100 of the vertical heat treatment apparatus is constituted as described above, and this main unit 100 is installed inside a clean room. However, in addition to the main unit, the vertical heat treatment apparatus is also equipped with auxiliary equipment such as a vacuum pump to turn the inside of the reaction tube 21 into a vacuum, a process gas supply unit and so forth. The auxiliary equipment is sometimes installed below a room in which the main unit 100 is installed, for example in a basement room.

Figure 3:
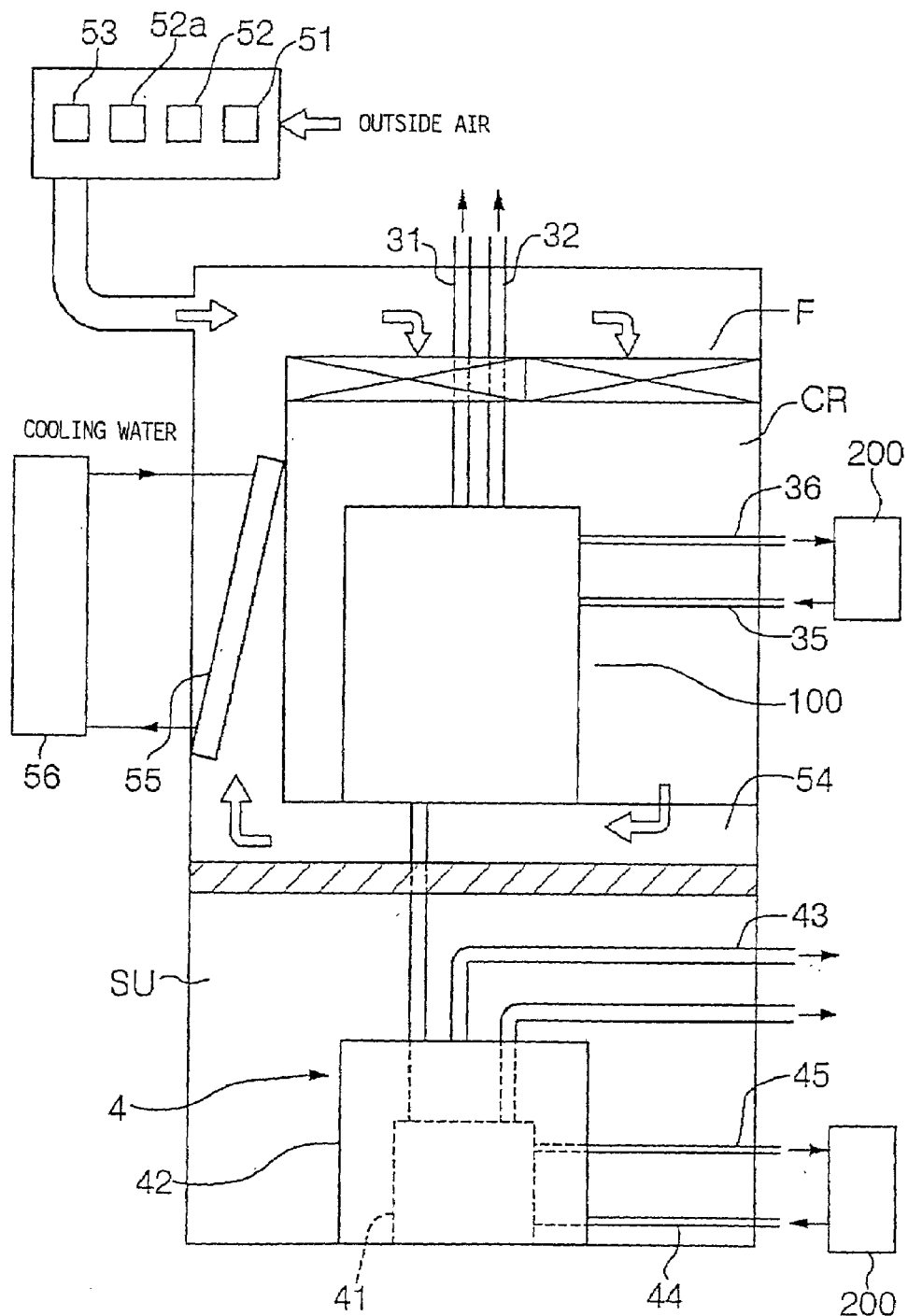
FIG. 3 is a schematic lateral view of a layout of a main unit and an auxiliary unit of the vertical heat treatment apparatus.

FIG. 3 is a diagram showing a state in which the main unit 100 is installed in a clean room CR and an auxiliary unit 4 equipped with a vacuum pump is installed in a basement SU, respectively. The auxiliary unit 4 is composed of auxiliary equipment such as the vacuum pump 41 contained inside a housing 42, with an interior of the housing 42 exhausted by an exhaust duct 43 like the main unit 100. Additionally, the cooling water is exhausted from a pipe 44 to a pipe 45, via a flow path provided on an outer periphery of the vacuum pump 41. The expelled cooling water is cooled to a predetermined temperature by a cooling system 200 and circulated. In FIG. 3, the cooling system for the cooling water for the main unit 100 is also indicated by the reference numeral 200.

In FIG. 3, an environmental control unit 5 that takes outside air into the interior of the clean room comprises a fan 51, a heater 52, a humidifier 53 and a cooler/dehumidifier 52a. A filter unit F is provided on the ceiling of the clean room CR. Air that has been treated to a predetermined temperature and humidity by the environmental control unit 5 forms a downflow via the filter unit F and flows inside the clean room CR. Then, this air is sucked below the floor and flows along a circulation path 54, where it is cooled to a predetermined temperature of for example 23° C. by a dry coil 55 that is a cooling system supplied with cooling water that is a cooling fluid from the cooling system 56.

Next, a description will be given of measuring the amount of heat discharged from the equipment used in the vertical heat treatment apparatus. The present managing apparatus, as shown in FIG. 2, comprises temperature sensors S1 and S2 that are temperature measuring means provided near an inner surface and an outer surface of the housing 10, respectively; anemometers V1 and V2 provided near inner and outer surfaces of the housing 10; a flow meter M1 provided on for example an intake side tube 35 of the cooling water for cooling the furnace 2; temperature sensors S3 and S4 that are temperature measuring means for measuring a temperature of the air exhaust provided inside the exhaust ducts 31 and 32 that exhaust the interior of the housing 10; anemometers V3 and V4 provided inside the exhaust ducts 31, 32 for measuring a wind speed of the air exhaust; and a temperature sensor S5 that is a temperature measuring means for measuring the temperature inside the clean room CR.

It should be noted that the example shown in FIG. 2 assumes that the temperature difference between the cooling water on the intake side and on the exhaust side is constant. However, where the temperature difference is not constant, a temperature measuring means is needed to measure the temperature of the cooling water inside the intake pipe 35 and the exhaust pipe 36. Additionally, the temperature sensor S5 is provided at a location at which it can measure an ambient temperature other than that of a portion that directly receives the effects of the heat from the main unit 100, for example, a portion several meters distant from the housing 10.

In this example, the air exhausted from the exhaust ducts 31 and 32 and the cooling water for cooling the furnace 2 correspond to the fluid that is a utility. Additionally, the cooling of the cooling water by the cooling system 200, corresponds to production of the fluid that is a utility, and the exhausting of the interior of the housing 10 corresponds to treatment of the fluid that is a utility. Moreover, sensors S1 through S4, anemometers V1 through V4 and flow meter M1 make up the factor measuring means for measuring the factors needed in order to obtain the amount of heat discharged from the heater 22 that is the equipment used in the semiconductor manufacturing apparatus.

The measured values measured by the factor measuring means are read into a personal computer 6 (hereinafter PC) that constitutes a measurements logging unit. A conversion module is provided that constitutes a signal conversion unit for the purpose of converting the signal levels of the individual measurements into signal levels that can be handled by the PC 6. In FIG. 2, 71 is a conversion module that converts the signal levels of the temperature measurements of the temperature sensors S1, S2; 72 is a conversion module that converts the signal levels of the wind speed measurements of the anemometers V1, V2; 73 is a conversion module that converts the signal levels of the temperature measurements of the temperature sensors S3, S4; 74 is a conversion module that converts the signal levels of the wind speed measurements of the anemometers V3, V4; and 75 is a conversion module that converts the signal level of the flow measurements of the flow meter M1. Additionally, 76 is a conversion module that converts the signal level of the temperature measurements of the temperature sensor S5.

The temperature sensors S1, S2, S5 and the anemometers V1, V2 are detachably attached to the measuring points. The temperature sensors S1, S2 are composed of thermocouples that can be attached to and removed from the housing, for example. These measuring means are mounted to end parts of wiring connected to the conversion modules 71, 72, 76 to be described later, and can be operated together with the PC 6. At the same time, the temperature sensors S3, S4, the anemometers V3, V4 provided on the exhaust ducts 31, 32 and the flow meter M1 provided on the cooling water pipe 35 are fixed with respect to the measuring points. These measuring means are detachably connected to wiring that is connected to the conversion modules 73, 74 75.

Figure 4:
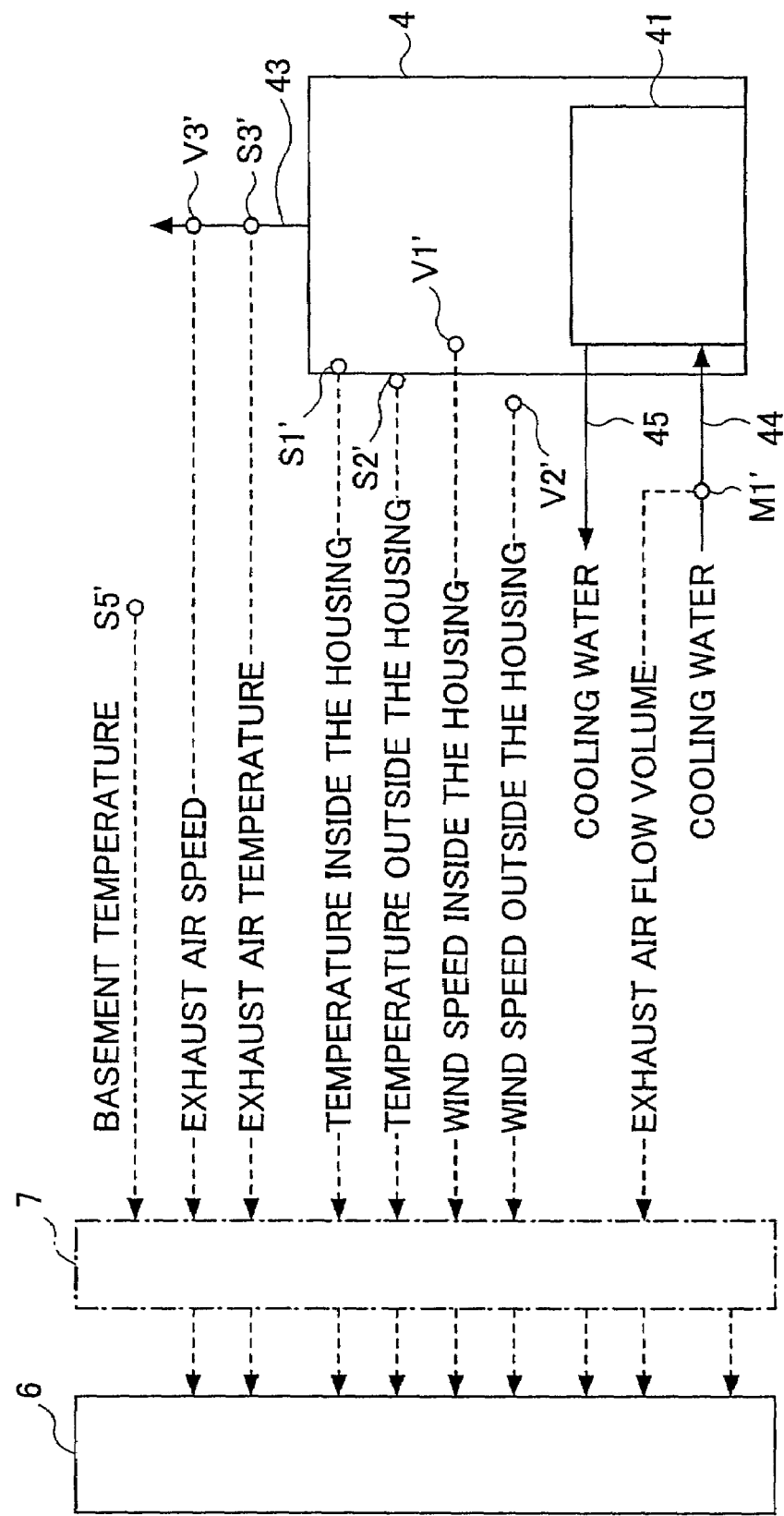
FIG. 4 is an illustrative diagram showing measurements needed for an amount of heat discharged for an auxiliary unit used in a vertical heat treatment apparatus being read into a personal computer.

According to the above-described configuration, it is possible to obtain the amount of heat discharged from the main unit 100 as will be described later. Additionally, it is possible to obtain the amount of heat discharged from the auxiliary unit 4 as well as shown in FIG. 4 in the same way. In FIG. 4 an apostrophe (') is added to the reference number of the measuring means that corresponds to the measuring means shown in FIG. 2 so as to avoid repeating the description. For example, as the anemometer that measures wind speed inside the exhaust duct 43 that exhausts the inside of the housing 42, the reference number S3' is used to correspond to the anemometer S3 shown in FIG. 2. 4In other words, the wind speed and the temperature inside and outside the housing 4, the supply (that is, the flow) of cooling water to the vacuum pump 41, and the speed and temperature of the air flowing inside the exhaust duct 43 are read into the PC 6 via the conversion module 7 (indicating all the conversion modules as a group).

Figure 5:
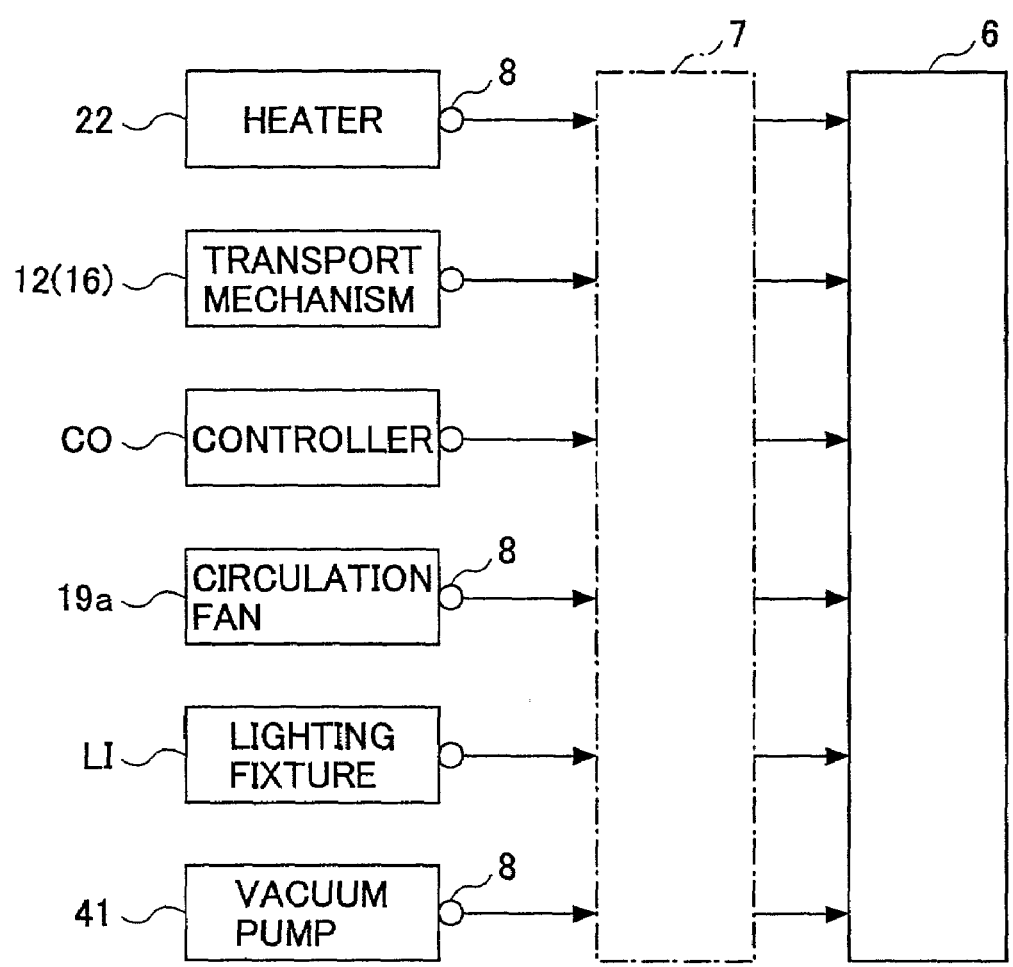
FIG. 5 is an illustrative diagram showing measurements of power consumption of electrical equipment used in a vertical heat treatment apparatus being read into a personal computer.
Figure 6:
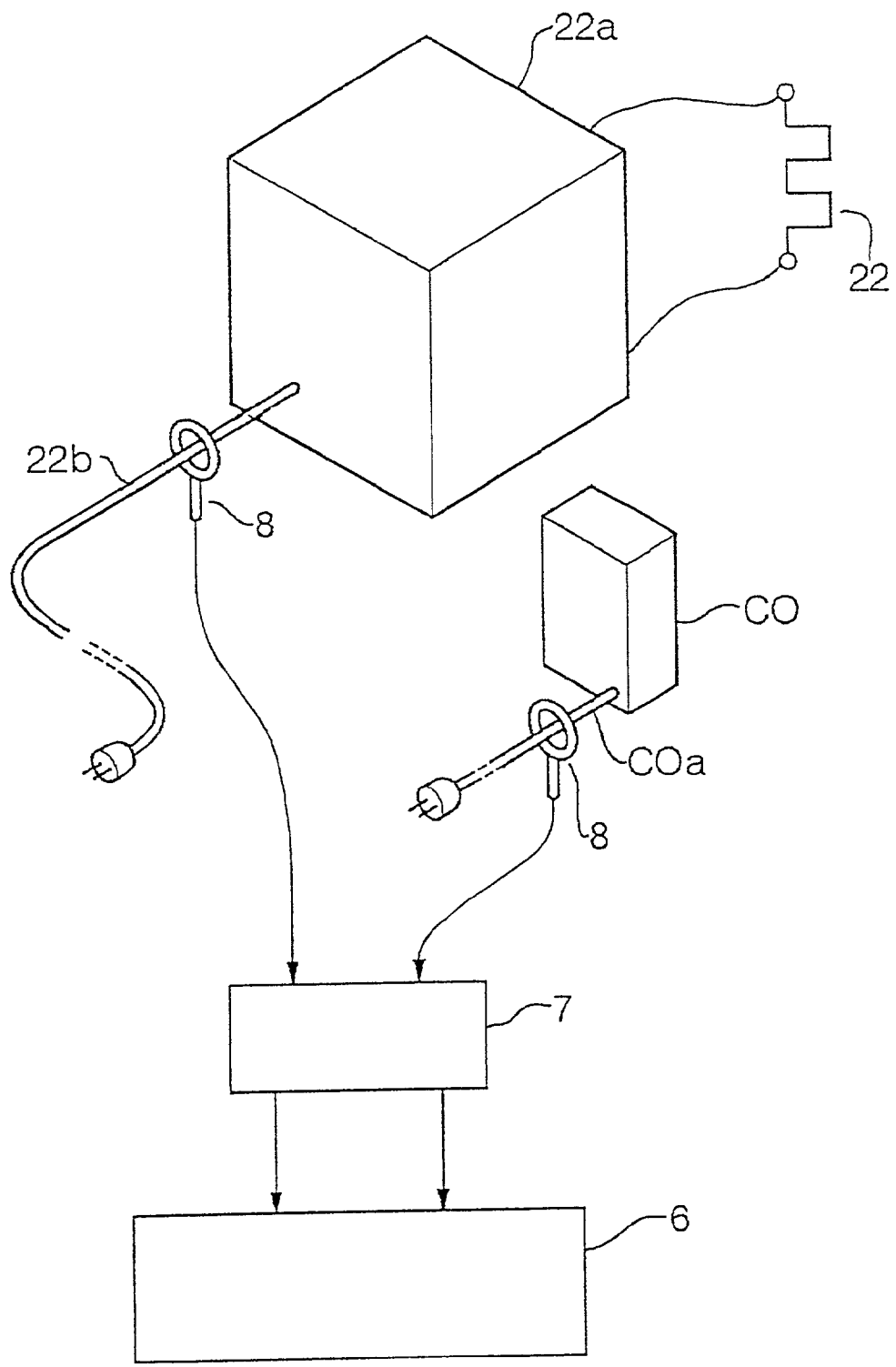
FIG. 6 is an illustrative diagram showing a state of measurement of power consumption of electrical equipment.

Next, a description will be given of the tracking of the power consumption consumed by the electrical equipment used in the vertical heat treatment apparatus. The power consumption of the electrical equipment provided in each of the vertical heat treatment apparatuses is measured directly by a power meter unit. Power consumption of electrical equipment common to a plurality of vertical heat treatment apparatuses, for example exhaust fans 33, 34 for exhausting the interior of the housing 10, is obtained indirectly from the operation of a single vertical heat treatment apparatus based on the measurements for wind amounts of the exhaust ducts 31, 32 of each apparatus. As shown in FIG. 5, the main pieces of electrical equipment for which power consumption is measured directly include the heater 22, the carrier transport mechanism 12, the wafer transport mechanism 16, a controller CO that controls the heater 22 and the transport mechanisms 12 and 16, the circulation fan 19$a$, a lighting fixture L1 provided inside the main unit 100 and the vacuum pump 41. A power meter 8 that is an electric power measuring means composed of for example a single-turn coil is set on a feeder to these pieces of electrical equipment and the power consumption is measured and read into the PC 6 via the conversion module 7. FIG. 6 is a diagram showing a sample power measurement, showing power meters 8 set on a feeder cable 22$b$ for supplying electric power to an electric power supply unit 22$a$ of the heater 22 and a feeder cable COa of the controller CO.

Figure 7:
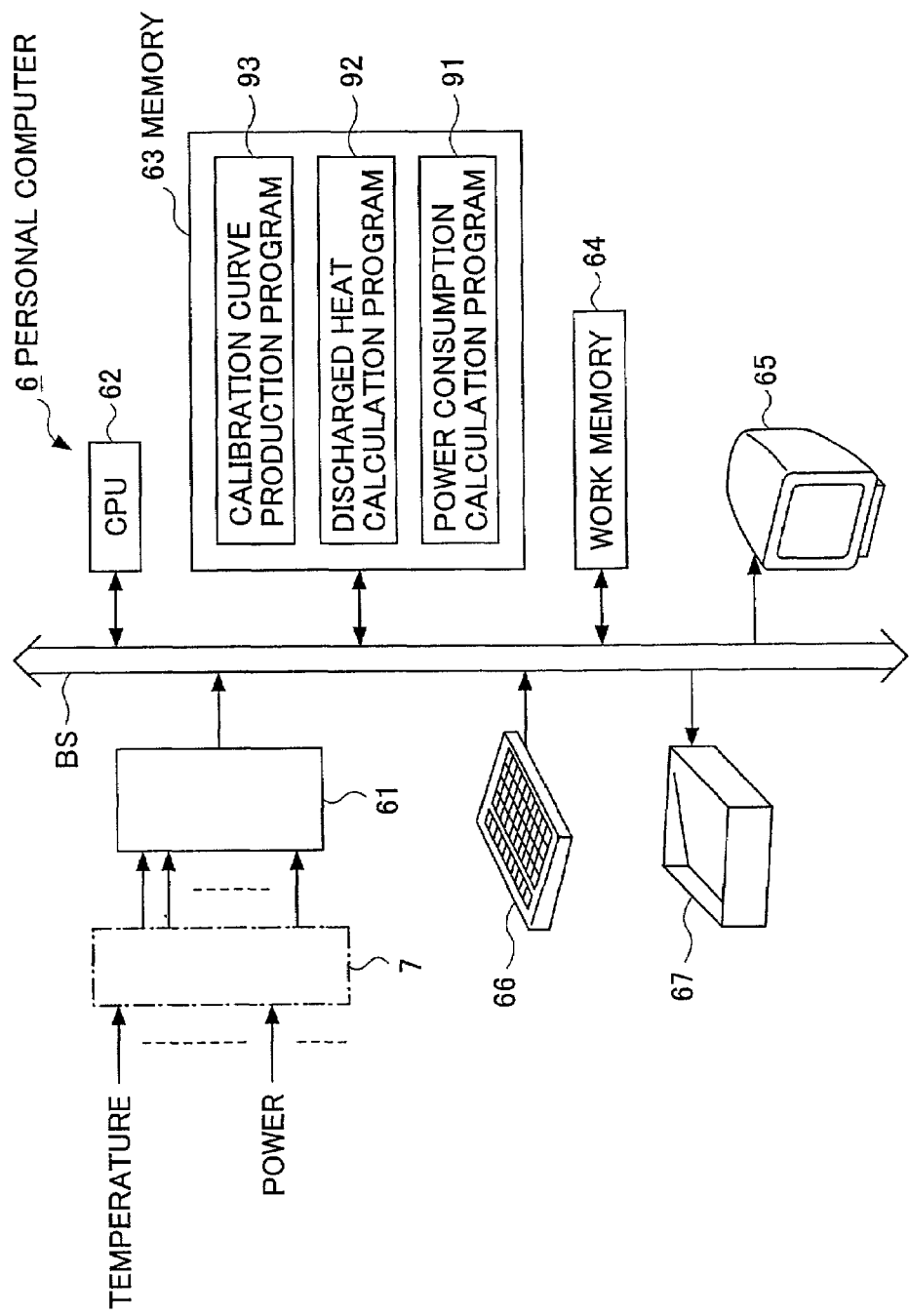
FIG. 7 is an illustrative diagram showing a composition of a personal computer.

A description will now be given of the configuration of the PC 6 that forms the measurement logging, with reference to FIG. 7. The PC 6 comprises a bus BS, a signal input unit 61, a CPU (central processing unit), a memory 63 that contains certain programs, a work memory 64, a display unit 65 such as a CRT display monitor or a liquid crystal display, and an input unit 66 such as a keyboard 66. Further, a printer 67 is connected to the bus BS. It should be noted that the display unit 65 may be configured to use the vertical heat treatment apparatus control panel. Signals corresponding to temperature measurements sent via the conversion module 7 are read into the PC 6 via the signal input unit 61 and undergo data processing by a program inside the memory 63.

Included in the particular programs are a power consumption calculation program 91, a discharged heat calculation program 92 and a calibration curve production program 93. As explained previously, the power consumption calculation program 91 is used to obtain, as an amount of heat, a combination of directly measured values for the power consumption of the electrical equipment shown in FIG. 5 and indirectly measured values for the power consumption of the electrical equipment common to each of the vertical heat treatment apparatuses as a heat amount. The discharged heat calculation program 92 is used to obtain how much heat is released from the apparatus during operation of a single vertical heat treatment apparatus based on individual measurements. That is, the discharged heat calculation program 92 is used to calculate an amount of heat Q1 discharged into the clean room CR from inside the housing 10, an amount of heat Q2 removed by air from inside the housing 10 via the exhaust ducts 31, 32, and amount of heat Q3 removed by cooling water circulating through the pipes 35, 36, and similar amounts of heat Q1', Q2' and Q3' discharged from the auxiliary unit 4. The calibration curve production program 93 concerns measuring temperatures inside and outside the housing 10, and is used to produce an interrelation (calibration curve) between individual measuring points when the apparatus is operated under a variety of conditions. By using this calibration curve, it is possible to estimate the temperature of other measuring points from the temperature of certain designated measuring points.

Figure 8:
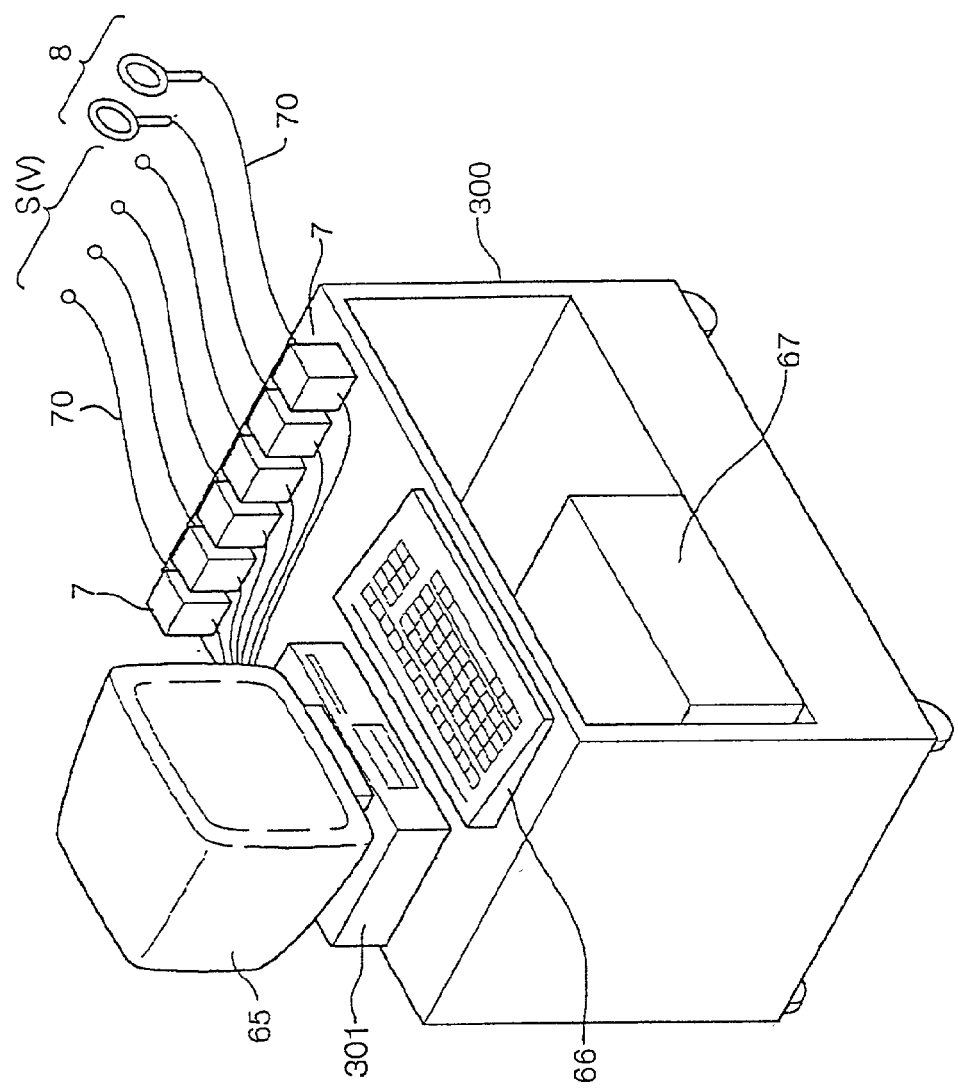
FIG. 8 is a perspective view of a managing apparatus according to a first embodiment of the present invention.

An external view of a managing apparatus of a semiconductor manufacturing apparatus according to an embodiment of the present invention is shown in FIG. 8. In this managing apparatus, a main unit 301 of the PC 6 together with the display unit 65 (a CRT display monitor), the input unit 66 (keyboard), the printer 67 and the conversion module 7 are loaded aboard a cart 300. Wiring (signal wires) 70 are connected to the conversion module 7. Temperature sensors S and anemometers V are connected to ends of some of the wiring 70.

A description will now be given of a working of the above-described embodiment. First, the cart shown in FIG.

8 is moved to the location of the vertical heat treatment apparatus to be measured, the temperature sensors S1, S2 and the anemometers V1, V2 are mounted on the housing 10 and the temperature sensors S3, S4 and the anemometers V3, V4 are mounted on the exhaust ducts 31, 32, and these temperature sensors and anemometers are connected to the individual conversion modules 73, 74, 75 using the wiring 70 (see FIG. 8). Further, as shown in FIG. 5 and FIG. 6, power meters 8 are set on the feeders for the heater 22 and other electrical equipment. Additionally, the laying of wiring to the auxiliary unit 4 installed in the basement is carried out, for example, by using holes provided in the floor to accommodate groups of wires. After this initial setting up has been performed, an amount of heat discharged per heat processing apparatus is obtained using items like those of a) below, and the amount of energy consumed per apparatus is obtained using items like those of b) below.

a) Measuring the Amount of Heat Discharged

For one vertical heat treatment apparatus, obtain the amount of heat discharged via the housing 10, the amount of heat discharged via the exhaust ducts 31, 32 and the amount of heat discharged via the cooling water from the discharged heat calculation program 92 based on individual measurements, and add together.

1) The amount of heat discharged from the housing 10 (the amount of heat processed by the circulation cooling coil based on discharge into the clean room from the housing 10) is obtained in the following manner:

Items to be Measured:

TA: ambient temperature inside the housing (° C.)
TB: ambient temperature outside the housing (° C.)
VA: surface wind speed inside the housing (m/sec)
VB: surface wind speed outside the housing (m/sec)

Already Known Items:

k: coefficient of thermal conductivity (kcal/m·hr·° C.)
$\Delta X$: housing thickness (m)
A: surface area of housing (m$^2$)

Values to be Calculated:

hA: ambient coefficient of thermal conductivity near interior surface of housing (kcal/m$^2$·hr·° C.)
hB: ambient coefficient of thermal conductivity near exterior surface of housing (kcal/m$^2$·hr·° C.)
U: overall heat transfer coefficient (kcal/m$^2$·hr·° C.)

Calculation Equations:

Process heat amount $Q1$ (kcal/min)=$U \cdot A \cdot (TA-TB)$ $U=1/(1/hA+\Delta X/k+1/hB)$ $hA=5.0+3.4 \cdot VA[V \leq 5\ m/sec]$ $hB=6.14+VB0.76[V>5\ m/sec]$ In other words, the panel surfaces of the housing 10 are divided into a plurality and temperatures inside and outside the housing 10 corresponding to those partitioned regions are measured. That is, temperature near an interior surface of the housing 10 in a given partitioned region is assumed to be uniform and temperature near an exterior surface of the housing 10 in such partitioned region is also assumed to be uniform, with the surface area of such partitioned region taken as a surface area of a transfer surface over which heat transfer takes place. It should be noted that, with respect to wind speed, it is most preferred to establish precise measuring points corresponding to area temperatures of the housing. However, it is acceptable for example to measure only a handful of measuring points and use the measurements so obtained. Additionally, it is acceptable to assume that a minimal amount of heat is discharged in regions in which the temperature inside the housing is not that high experience, so these regions may be ignored.

It is preferable to provide several hundred temperature measuring points in order to perform the most accurate temperature measurements possible, although in terms of the amount of work involved it is inadvisable to do so. Accordingly, in this embodiment, a calibration curve production program 93 is provided. In other words, the vertical heat treatment apparatus is operated under a variety of conditions, measuring points that are temporally interrelated are automatically or arbitrarily selected, a temperature interrelationship between the temperature of a given measuring point and the temperature of another portion is tracked, and a calibration curve having a temporal interrelationship is produced. This calibration curve production process is carried out by the calibration curve production program 93, which estimates the temperature of other portions based on the temperature of the given measuring points and on the calibration curve, and calculates the amount of heat discharged with respect to the temperature measurements of other portions based on those estimated values.

Figure 9A:
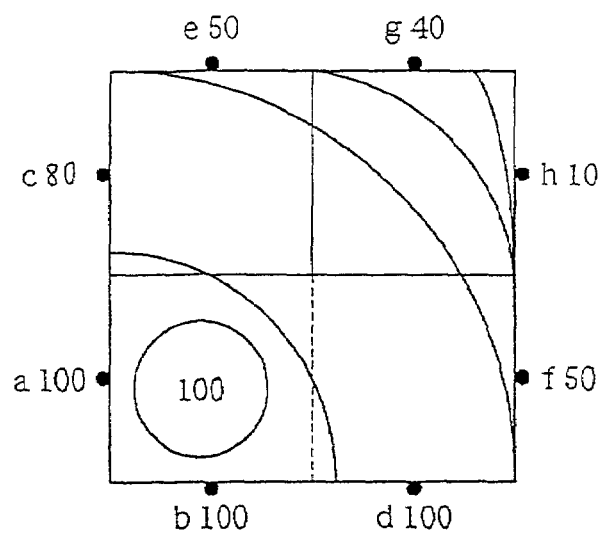
FIGS. 9A, 9B and 9C are illustrative diagrams showing sample temperatures of individual measuring points near a housing.
Figure 9B:
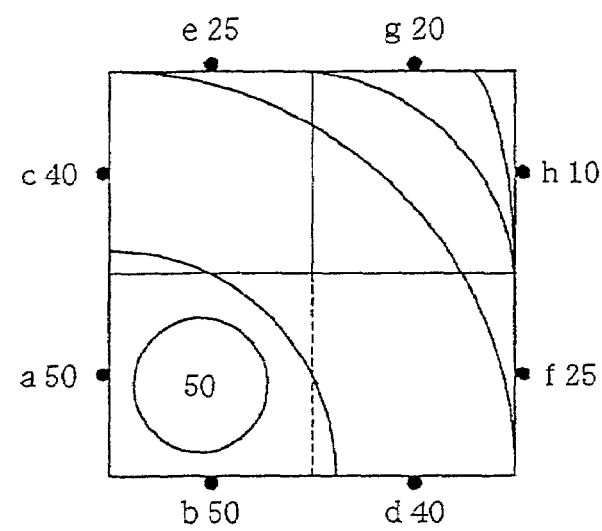
Figure 9C:
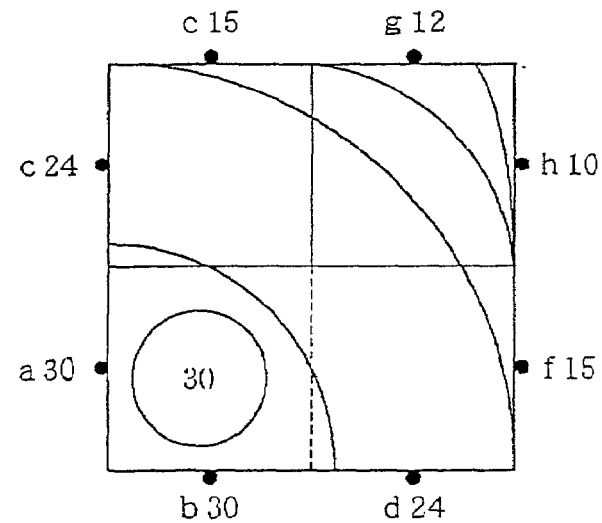
Figure 10A:
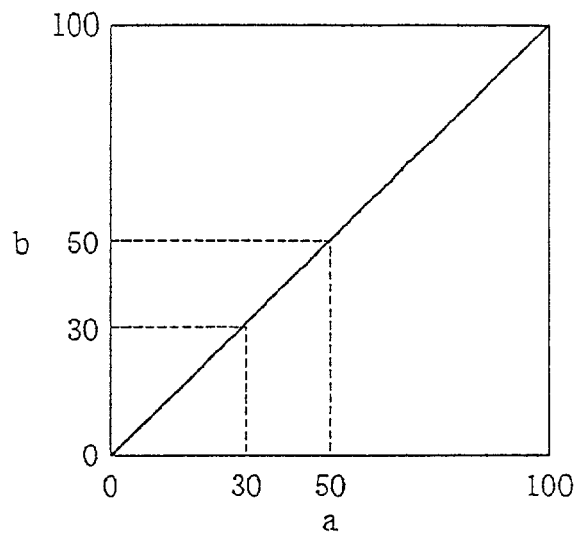
FIGS. 10A, 10B and 10C are graphs showing calibration curves indicating a relation between temperatures of certain specific measuring points and temperatures of other measuring points.
Figure 10B:
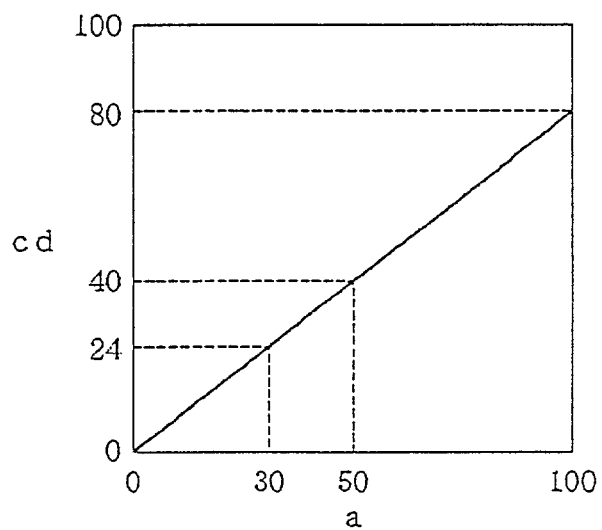
Figure 10C:
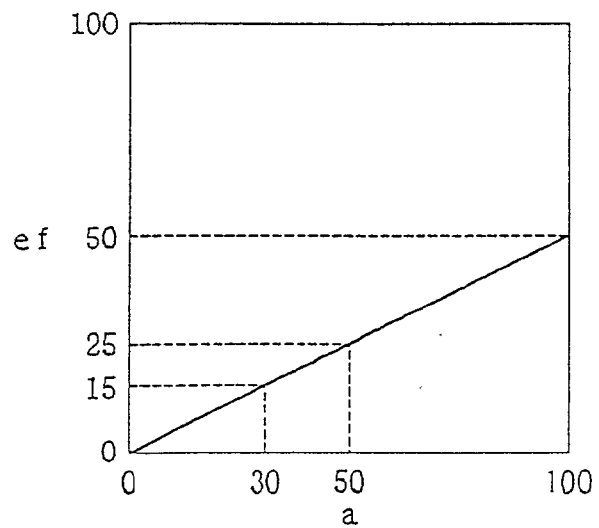

FIGS. 9A–9C and FIGS. 10A–10C are diagrams illustrating the production of a calibration curve. In FIGS. 9A–9C, the square frame indicates the housing 10 and the circle inside the housing 10 indicates the furnace 2, with the region divided by the curved line being the same temperature ambience. In this example, when measuring point a is 30° C., 50° C. and 100° C., the approximate temperature of the other measuring points b–h are tracked and a calibration curve like that of FIG. 10 between the temperature of point a and the temperatures of the other points b–h is produced. Using a calibration curve produced in this manner provides the advantage that the temperatures of points b–h can be estimated even without measuring the temperatures of points b–h based on the temperature measurement of point a, and therefore the number of measuring points can be reduced.

2) The amount of heat discharged through the exhaust ducts 31, 32 (amount of heat processed by the exhaust system) is obtained as follows:

Items to be Measured:

Te: exhaust temperature (° C.)
Qe: exhaust airflow (m$^3$/min)
Tc: clean room ambient temperature (° C.)

Calculation Equation:

Amount of heat processed $Q2$ (kcal/min)=$0.29 \times (Te-Tc) \times Qe$

Here, the specific heat in the case of air is 0.29 (kcal/° C.·m$^3$).

3) The amount discharged to the cooling water from the furnace 2 (the amount of heat processed by the cooling system) is obtained as follows:

Items to be Measured:

W: cooling water flow (m$^3$/min)

Already Known Items:

$\Delta T$: temperature difference between the intake and the exhaust sides of the flow path inside the furnace
Cw: specific heat (kcal/° C.·m$^3$)

Calculation Equation:

Amount of heat processed $Q3$ (kal/min)=$Cw \cdot \Delta T \cdot W$

It should be noted that each of the processed heat amounts may also be obtained by obtaining instantaneous measurements and integrating them. For example, when solving for Q3 in a case in which the temperature difference $\Delta T$ is not uniform, the temperature of the cooling water on the intake side and on the exhaust side may be measured and the calculation made in which $Q3=\{Cw$ (specific heat of water$)\times W$ (flow$)\times \Delta T\}$.

b) Calculation of Power Consumption

The amount of power consumed as taken in by the power meters 8 is added together to obtain the sum total (kWh: amount of power per hour).

Additionally, as for the power consumption needed for exhaust by the exhaust ducts 31, 32: The exhaust fans 33, 34 are common to a plurality of vertical heat treatment apparatuses, so the airflow (m³/h) for the exhaust fans 33 (34) is obtained by multiplying the wind speed measured by the anemometers V3 (V4) by the cross-sectional surface area of the exhaust ducts 31 (32). The amount of power consumed by the exhaust fans 31, 32 on a per-apparatus or a per-accessory-unit basis is obtained by multiplying the airflow by the amount of power consumed on a per-flow-unit basis as obtained by dividing the rated power (kWh) of the exhaust fan by the rated processing volume (m³/h) of the exhaust fan. Thus:

> The amount of power consumed by the exhaust fans on a per-apparatus basis (kWh)=wind speed inside the exhaust duct (m/h)×cross-sectional surface area of the exhaust duct (m²)×{exhaust fan rated power (kWh)/exhaust fan rated processing airflow (m³/h)}

Further, by this exhaust, air is expelled from the inside of the clean room to the outside, so just that amount of outside air is taken into the clean room through the outside air treatment unit (see FIG. 3: Hereinafter referred to as environmental control unit). Accordingly, it is necessary to obtain also the amount of power consumed by the related systems equipment including the environmental control unit 5 that consumes when the aforementioned exhaust airflow (m³/h) of air is taken in.

In order to obtain this amount of power consumed, first, the rated power (kWh) of the fan 51 of the environmental control unit 5 is divided by the rated processing volume (m³/h) of the environmental control unit 5 to obtain the amount of power consumed per unit supply of air (m³/h). Then, the amount of power consumed by equipment for the warming or heating coil, the humidifying coil, and the cooling/dehumidifying coil is similarly obtained. Further, by multiplying the respective amounts of power consumed by the aforementioned exhaust airflow and adding the products, the amount of power consumed by the related systems equipment including the environmental control unit 5 is obtained.

The details thereof are given in the equation below:

> Amount of power consumed (kWh) per unit supply of air={fan-related power consumption (kWh)}+{warming or heating coil-related power consumption (kWh)}+{humidifying coil-related power consumption (kWh)}+{cooling/dehumidifying coil-related power consumption (kWh)}

Each of the items on the right side of the above equation can be expressed by the equations below.

> Fan-related power consumption (kWh)={environmental control unit fan rated power (kWh)/environmental control unit fan rated processing airflow (m³/h)}×exhaust airflow (m³/h)

> Warming or heating coil-related power consumption (kWh)={rated warming or heating process equipment power consumption (kWh)×warming or heating processing equipment load factor/environmental control unit fan rated processing airflow (m³/h)}×exhaust airflow (m³/h)=[[rated warming or heating process equipment power consumption (kWh)×{warming or heating rated capacity of environmental control units to be measured (kcal/h)/total sum of warming or heating rated capacities of all environmental control units (kcal/h)}]/environmental control unit fan rated processing airflow (m³/h)]×exhaust airflow (m³/h)

Here, the warming or heating process equipment means boilers and electric heaters. Therefore, "rated warming or heating process related power consumption" means the rated amount of power consumed by boilers or heaters. Additionally, the units for each of the "warming or heating rated capacity of environmental control units to be measured" as well as "total sum of warming or heating rated capacities of all environmental control units" may each be (kg/h) when the heating element is as above, and may be (kWh) when the heating element is an electric heater.

> Humidifying coil-related power consumption (kWh) =[{rated humidifying equipment power consumption (kWh)×humidifying equipment load factor}/environmental control unit fan rated processing airflow (m3/h)]×exhaust airflow (m3/h)=[[rated humidifying equipment power consumption (kWh)×{rated humidifying capacity or rated vapor spray capacity of environmental control units to be measured (kg/h)/total sum of humidifying or vapor spray rated capacities of all environmental control units (kg/h)}]/environmental control unit fan rated processing airflow (m³/h)]×exhaust airflow (m³/h)

> Cooling/dehumidifying coil-related power consumption (kWh)=[{rated cooling/dehumidifying equipment power consumption (kWh)×cooling/dehumidifying equipment load factor}/external control fan rated processing airflow (m³/h)]×exhaust airflow (m³/h)=[[rated cooling/dehumidifying equipment power consumption (kWh)]×{cpp;omg/dehumidifying rated capacity of environmental control units to be measured (kcal/h)/total sum of cooling/dehumidifying rated capacities of all environmental control units (kcal/h)}]/external control fan rated processing airflow (m³/h)]×exhaust airflow (m³/h)

Further, as for the amount of power consumed as necessary to supply cooling water to the furnace 4, the cooling system 200 is common to a plurality of vertical heat treatment apparatuses, and accordingly, the amount of power consumed on a per-apparatus basis or on a per-accessory-unit basis is obtained by multiplying the flow measured by the flow meter M1 by the power consumption of the cooling system 200 on a per-unit-of-flow basis as obtained by the following equations.

> Power consumption of the cooling system 200 per unit of flow (kWh/m3/h)={cooler power consumption (kWh)+circulation pump rated power (kWh)}/circulation pump rated processable volume (m3/h)

> The power consumption (kWh) of the apparatuses and accessory equipment related to the cooling system on a per-apparatus or a per-accessory-unit basis:=power consumption of cooling system 200 per unit of flow (kWh/m3/h)×flow measured by flow meter M1 (m3/h).

Further and additionally, as for the power consumption needed by the circulatory cooling system (hereinafter called the dry coil) for the heat load discharged into the clean room ambience from the furnace 4, the discharge of heat by the apparatus exerts a load on the dry coil 55 as well as on the fan filter unit (hereinafter called the FFUF), and so it is necessary to consider the amount of power consumed by the equipment related to the dry coil 55 as well as to the FFUF.

The dry coil 55 and the FFUF are common to a plurality of vertical heat treatment apparatuses, and further, the cooling water supplied to the dry coil 55 is subject to a system configuration in which a circulation pump is common to a plurality of dry coils. By calculating according to the following equations the capacity of the systems equipment, the amount of heat measured according to the measurement method shown in "a) measurement of the amount of heat discharged 1) amount of heat discharged from the housing 10", and further, a variety of information relating to installation of the apparatus, the amount of power consumed per unit apparatus of the circulatory cooling system or per unit of accessory equipment is obtained.

> Power consumption (kWh) per apparatus of the circulatory cooling system or per accessory unit=
> [{cooler power consumption (kWh)+circulation pump rated power consumption (kWh}×
> {amount of heat discharged (Kcal/h)/dry coil coil cooling processable heat amount (kcal/h)
> }]+[total sum of rated power of all installed FFU (kWh)×{designated apparatus installed surface area ($m^2$)/total installed surface area of all equipment installed inside the same clean room ($m^2$)}].

> Or, power consumption (kWh) per apparatus of the circulatory cooling system or per accessory unit=[{cooler power consumption (kWh)+circulation pump rated power consumption (KWh)}×
> {amount of heat discharged (kcal/h)/dry coil cooling procesable heat amount (kcal/h)}]+[total sum of rated power of all installed FFU (kWh)×{1 unit (unit)/number of apparatus units installed inside the same clean room (units)}]

The amount of power consumed obtained in this manner is added and the sum total is multiplied by the factor 860 (kcal/h/kWh) to convert to a heat amount (kcal/h). This series of calculations is carried out by the power consumption program 91. It should be noted that figures for the auxiliary unit 4 are obtained in the same way, and it is also possible to take the sum of the amount of power consumed by each main unit 100 and auxiliary unit 4 as the amount of power consumed per apparatus.

The power consumption and the amount of heat discharged obtained as described above is displayed by the display means 65. As for the way in which that display is effected, as shown for example in FIG. 11, the power consumption, individual instantaneous values for the above-described individual amounts of heat discharged (heat discharged inside the chamber, hot air exhaust and cooling water) as well as the sum total of the amounts of heat discharged are continuously displayed in a window, and further, change over time in same is displayed as a dashed line graph. Additionally, FIG. 12 is a graph displaying values for power consumption and amount of heat discharged at particular times, and this graph, too, can be displayed by selecting display screen display.

According to the above-described embodiment, in operating a vertical heat treatment apparatus that is one example of a semiconductor manufacturing apparatus, exactly how much electric power is consumed, that is, how much heat is input into and how much heat is discharged from the apparatus, and of that discharged heat how much is discharged into the chamber, how much is discharged by exhaust and how much is discharged by cooling water, can be tracked. By tracking the heat budget in this way it is possible to discover the major causes of heat generation. In so doing, it becomes easy to obtain clues to measures for reducing the amount of heat generated, and as a result, is it possible to obtain a regime for optimum utilization of the facility, making it possible to attain energy efficiency.

(Second Embodiment)

According to the second embodiment of the present invention, a managing apparatus is provided having, in addition to the above-described capability to obtain the heat budget, a capability to track the operating cost and the level of $CO_2$ (carbon dioxide) generated by the vertical heat treatment apparatus on a per-apparatus basis. The configuration diagram of the PC 6 used in this embodiment is shown in FIG. 13. To the memory 63 are added a cost calculation program 94 and a $CO_2$ emission level calculation program 95.

Broadly speaking, operating costs are divisible into two groups. The first group consists of cooling costs engendered by the cooling system (corresponding to an amount of heat processed Q3), cooling costs engendered by the exhaust system (corresponding to an amount of heat processed Q2) as well as cooling costs engendered by the circulatory coil (corresponding to an amount of heat processed Q1) described in the first embodiment.

The equations by which these cooling costs are calculated are as follows.

<1> Cooling System Cooling Costs

> Cooling system cooling cost (yen/h)=amount of heat discharged to the cooling system (kcal/h)×unit cost to cool the cooling water (yen/kcal)

or

> cooling system cooling cost (yen/amount of time designated for measurement): Addition during designated measurement time=amount of heat discharged to cooling water system (yen/amount of time designated for measurement)×unit cost to cool the cooling water (yen/kcal)

Same for others.

<2> Exhaust System Cooling Costs

> Exhaust system cooling cost (yen/h)=amount of heat discharged to the exhaust system (kcal/h)×unit cost to cool the exhaust (yen/kcal)

It should be noted that the exhaust system mentioned here means the fan that carries out exhaust (including also a fan that has a scrubber function) and outside air intake equipment required to supply air upon exhaust (environmental control unit, etc.). Additionally, the unit cost of cooling the exhaust means the cost of operating the equipment needed in order to cool a unit amount of heat when heat is exchanged with the exhaust (is cooled).

<3> Circulatory Cooling Coil Cooling Costs

> Cooling costs for the circulatory cooling coil (yen/h)
> =amount of heat discharged to the circulatory cooling coil (kcal/h)×unit cost of circulatory cooling (yen/kcal)

Values obtained for the first embodiment are used in the calculations for each of the amounts of heat discharged in <1> through <3> above. Additionally, each unit cost of cooling the exhaust is obtained in advance and entered into the cost calculation program 94. The cost calculation program 94 calculates individual cooling costs using the above-described calculation equations.

The second group consists of costs relating to electricity and to utilities such as water. These costs are obtained by measuring the amount of utilities consumed and the volume of exhaust and multiplying the measured values by unit cost. A description is given below of the ways of obtaining these costs.

(Items to be Measured with Respect to Utility and Exhaust Costs)

The following items <1> through <7> are measurement items with respect to utility and exhaust.

<1> Electricity

Measurement item: Power consumption (kWh)

<2> Gas 1) $N_2$, 2) $O_2$, 3) Dry-Air, 4) LP gas

1) $N_2$

Measurement item: Consumed $N_2$ flow (L/h, or $m^3$/h)

2) $O_2$

Measurement item: Consumed $O_2$ flow (L/h, or m3/h)

3) Dry-Air

Measurement item: Consumed Dry-Air flow (L/h, or $m_3$/h)

4) LP gas

Measurement item: Consumed LP gas flow (L/h, or $m^3$/h)

Or the "consumed gas flow" may in some cases be measured by using only (L) or ($m^3$) as the cumulative amount consumed within a designated measurement time.

Same for the others.

<3> Distilled Water

1) Primary distilled water

Measurement item: Consumed primary distilled water amount (L/h or $m^3$/h)

2) Secondary distilled water

Measurement item: Consumed secondary distilled water amount (L/h or $m^3$/h)

<4> Tap Water

Measurement item: Consumed tap water amount (L/h or $m^3$/h)

<5> Wastewater

1) Low-concentration wastewater

Measurement item: Low-concentration wastewater amount (L/h, or $m^3$/h)

2) High-concentration wastewater

Measurement item: High-concentration wastewater amount (L/h, or $m^3$/h)

<6> Cooling Water

Measurement item: Cooling water flow (L/h, or $m^3$/h)

<7> Exhaust

1) Exhaust system consisting only of an air-exhaust ventilator

Measurement item: Exhaust airflow ($m^3$/h)

2) Exhaust system having a scrubber function

Measurement item: Exhaust airflow ($m^3$/h)

The electricity that is the utility in <1> is the electricity supplied to the electrical equipment. The main pieces of electrical equipment, as described in the first embodiment, are the heater 22, the carrier transport mechanism 12 and wafer transport mechanism 16, the controller CO, the circulation fan 19a, the lighting fixture LI provided inside the main unit 100, the vacuum pump 41, and so forth.

The $N_2$ gas (nitrogen gas) of <2> refers to the fact that the wafer loader chamber 15 is a sealed environment in order to restrict the growth of a natural oxidation layer on the wafer. $N_2$ is sometimes supplied to the chamber as an inert gas and the inside of the chamber is pressurized. This is the $N_2$ gas referred to.

Additionally, in some cases gasses that are a by-product of reactions as well as unreacted gasses included in the exhaust gas expelled from the reaction tube 21 are combusted by the gaseous fuel LPG and dry air (Dry-Air). The LPG and dry air (Dry-Air) of <2> corresponds to this.

The exhaust of <7> is an item for obtaining the cost that corresponds to the load on the cooling system 56 consisting of the heater 52, humidifier 53 and cooler/dehumidifier 52a of the environmental control unit 5 (see FIG. 3) from just the flow volume exhausted by the exhaust ducts 31, 32, and is necessary to obtain the exhaust airflow. The distilled water of <3> and the wastewater of <7> have no bearing on the vertical heat treatment apparatus described in this embodiment, but are listed as an item of description because they are included in the program 84 so as to be able to accommodate semiconductor manufacturing apparatuses that use chemical solutions, for example coating and developing apparatuses that coat as well as develop a resist.

(Calculating the Cost of Utilities and Exhaust)

<1> through <7> below indicate unit cost per each utility and exhaust, and at the same time, indicate calculation equations for the purpose of obtaining costs from those unit costs and from consumed amounts that are measured values as described above.

<1> Electricity measurement item: Amount of power consumed (kWh)

Electricity cost (yen)=Amount of power consumed (kWh)×unit cost of power (yen/kWh)=Amount of power consumed (kWh)×[{previous fiscal year basic use fee (including contract power fee) (yen/month)+amount of power consumed per factory unit (kWh/month)×unit cost of purchased power (yen/kWh)}÷amount of power consumed per factory unit (kWh/month)]

<2> Gas {1} $N_2$, 2) $O_2$, 3) Dry-Air, 4) LP gas}

1) $N_2$ (when supplied from on-site facility)

Measurement items: Consumed $N_2$ flow volume ($m^3$)

$N_2$ cost (yen)=Consumed $N_2$ flow volume ($m^3$)×$N_2$ unit cost (yen/$m^3$)=Consumed $N_2$ flow volume ($m^3$)×{previous fiscal year contract fee (yen/month)÷standard production volume ($m^3$/month)}

2) $O_2$ (when supplied from CE tank)

Measurement items: Consumed $O_2$ flow volume ($m^3$)

$O_2$ cost (yen)=Consumed $O_2$ flow volume ($m^3$)×$O_2$ unit cost (yen/$m^3$)=Consumed $O_2$ flow volume ($m^3$)×[{amount of liquefied gas purchased ($m^3$/month)×unit cost of purchased liquefied gas (yen/$m^3$)+CE amount of power consumed (kWh/month)×unit cost of electric power (yen/kWh)+CE replaceable parts cost (yen/month)}÷purchased amount ($m^3$/month)]

3) Dry-Air

Measurement items: Consumed Dry-Air flow volume ($m^3$)

Dry-Air cost (yen)=Consumed Dry-Air flow volume ($m^3$)×Dry-Air unit cost (yen/$m^3$)=Consumed Dry-Air flow volume ($m^3$)×{compressor rated power (kWH/h)×unit cost of electric power (yen/kWh)÷Dry-Air standard production volume ($m^3$/month)}

4) LP gas

Measurement items: Consumed Lp gas flow volume ($m^3$)=Consumed LP gas flow volume ($m^3$)×Lp gas unit cost (yen/$m^3$)=Consumed LP gas flow volume ($m^3$)×{previous fiscal year uniform capacity pump purchase unit cost (yen/pump)÷pump capacity ($m^3$)}

<3> Distilled Water

1) Primary distilled water

Measurement items: Consumed primary distilled water flow volume (t): t=$m^3$

Primary distilled water cost (yen)=Consumed primary distilled water flow volume (t)×primary distilled water unit cost (yen/t)=Consumed primary distilled water flow volume (t)×[{tap water used volume (t/month)×tap water unit cost (yen/t)+primary distilled water production facility power consumption (kWh/month)×unit cost of electric power (yen/kWh)+primary distilled water production facility replaceable parts cost (yen/month)}÷standard primary distilled water production volume (t/month)]

2) Secondary distilled water
Measurement items: Consumed secondary distilled water flow volume (t)

Secondary distilled water cost (yen)=Consumed secondary distilled water flow volume (t)×secondary distilled water unit cost (yen/t)=Consumed secondary distilled water flow volume (t)×[primary distilled water unit cost (yen/t)+secondary distilled water production facility power consumption (kWh/month)×unit cost of electric power (yen/kWh)+secondary distilled water production facility replaceable parts cost (yen/month)}÷standard secondary distilled water production volume (t/month)]

<4> Tap Water
Measurement item: Consumed tap water flow volume (t):

Tap water cost (yen)=Consumed tap water flow volume (t)×tap water unit cost (yen/t)=Consumed tap water flow volume (t)×[{previous fiscal year basic use fee (t/month)+consumption amount (t/month)×purchase unit price (yen/t)}÷consumption amount (t/month)]

<5> Wastewater
1) Low-concentration wastewater
Measurement item: Low-concentration wastewater volume ($m^3$)

Low-concentration wastewater treatment cost (yen) =Low-concentration wastewater volume ($m^3$)× low-concentration wastewater treatment unit cost (yen/$m^3$)=Low-concentration wastewater volume ($m^3$)×[{wastewater treatment equipment power consumption (kWh/month)×unit cost of electric power (yen/kWh)+wastewater treatment equipment replaceable parts cost}÷standard wastewater treatment volume ($m^3$/month)]

2) High-concentration waste water
Measurement item: High-concentration wastewater volume ($m^3$)

High-concentration wastewater treatment cost (yen) =High-concentration wastewater volume ($m^3$)× high-concentration wastewater treatment unit cost (yen/$M^3$)=High-concentration wastewater volume ($m^3$)×unit cost of removal of industrial waste products (yen/$m^3$)

<6> Cooling Water (Intake-exhaust Temperature Difference: $\Delta t$)
Measurement item: Consumed cooling water volume ($m^3$)

Cooling cost (yen)=Consumed cooling water volume ($m^3$)×unit cost of cooling water (yen/$m^3$)=Consumed cooling water volume ($m^3$)×[{$\Delta t$(° C.)× circulation pump rated flow ($m^3$/month)÷0.86 (kcal/h·kWh)×cooler cooling efficiency (kWh/kWh)+circulation pump rated power (kW)×24 (h)×30 (day)}×unit cost of electric power (yen/kWh)]÷circulation pump rated flow ($m^3$/month) =Consumed cooling water volume ($m^3$)×[{cooling water cooler power consumption (kWh/month)+circulation pump rated power (kWh/month)×unit cost of electric power (yen/kWh)] ÷circulation pump rated flow ($m^3$/month)

<7> Exhaust
1) Exhaust system consisting only of an air-exhaust ventilator
Measurement item: Exhaust airflow ($m^3$/h)

Exhaust cost (yen)=Exhaust airflow ($m^3$/h)×exhaust treatment unit cost (yen/$m^3$/h)=Exhaust airflow ($m^3$)×{unit cost of operating environmental control unit fan (yen/$m^3$/h)+unit cost of operating environmental control unit cooling coil (yen/$m^3$/h)+unit of operating humidifying coil (yen/$m^3$/h)+unit cost of operating warming coil (yen/$m^3$/h)+unit cost of operating exhaust fan (yen/$m^3$/h)}=Exhaust airflow ($m^3$/h)×[{environmental control unit fan rated power (kWh)× unit cost of electric power (yen/kWh)÷environmental control unit fan rated volume ($m^3$/h)+{ [temperature of the cooling water on the exhaust side of the cooling coil (° C.)−temperature of the cooling water on the intake side of the cooling coil (° C.)]×rated cooling water volume (L/h)×cooler cost (yen/kcal)÷environmental control unit fan rated volume ($m^3$/h)}+{rated vapor spray volume (kg/h)×humidifying unit cost (yen/kg)÷environmental control unit fan rated volume ($m^3$/h)}+{rated condensation volume (kg/h)×warming unit cost (yen/kg)÷environmental control unit fan rated volume ($m^3$/h) }+{exhaust fan rated power (kWh)×unit cost of electric power (yen/kWh)÷exhaust fan rated volume ($m^3$/h)}]

2) Exhaust system having a scrubber capability
Measurement item: Exhaust airflow ($m^3$/h)

Exhaust cost (yen)=Exhaust air flow ($m^3$/h)×exhaust treatment unit cost (yen/$m^3$/h)=Exhaust airflow ($m^3$/h)×{unit cost of operating environmental control unit fan (yen/$m^3$/h)+unit cost of operating environmental control unit cooling coil (yen/$m^3$/h)+unit of operating humidifying coil (yen/$m^3$/h)+unit cost of operating warming coil (yen/$m^3$/h)+unit cost of operating exhaust fan (yen/$m^3$/h)}=Exhaust airflow ($m^3$/h)×[{environmental control unit fan rated power (kWh)×unit cost of electric power (yen/kWh)÷environmental control unit fan rated volume ($m^3$/h)}+{ [temperature of the cooling water on the exhaust side of the cooling coil (° C.)−temperature of the cooling water on the intake side of the cooling coil (° C.)×rated cooling water volume (L/h)×cooling cost (yen/kcal)÷environmental control unit fan rated volume ($m^3$/h)}+{rated vapor spray volume (kg/h)×humidifying unit cost (yen/kg)÷environmental control unit fan rated volume ($m^3$/h)}+{rated condensation volume (kg/h)×warming unit cost (yen/kg)÷environmental control unit fan rated volume ($m^3$/h) }+{[exhaust fan rated power (kWh)+circulation pump rated power (kWh)]×unit cost of electric power (yen/kWh)÷exhaust fan rated volume ($m^3$/h)}]

It should be noted that each measured value (consumption amount) is a value read in for the purpose of obtaining the heat budget. Using those values it is possible to obtain the cost for each individual item. Further, depending on the type of machinery, steam may be generated as a reaction byproduct that is the result of carrying out heat treatment. In such cases, the cost of eliminating the condensation of this steam is also added. However, the amount of condensation involved is very small, and may be ignored.

Figure 14:
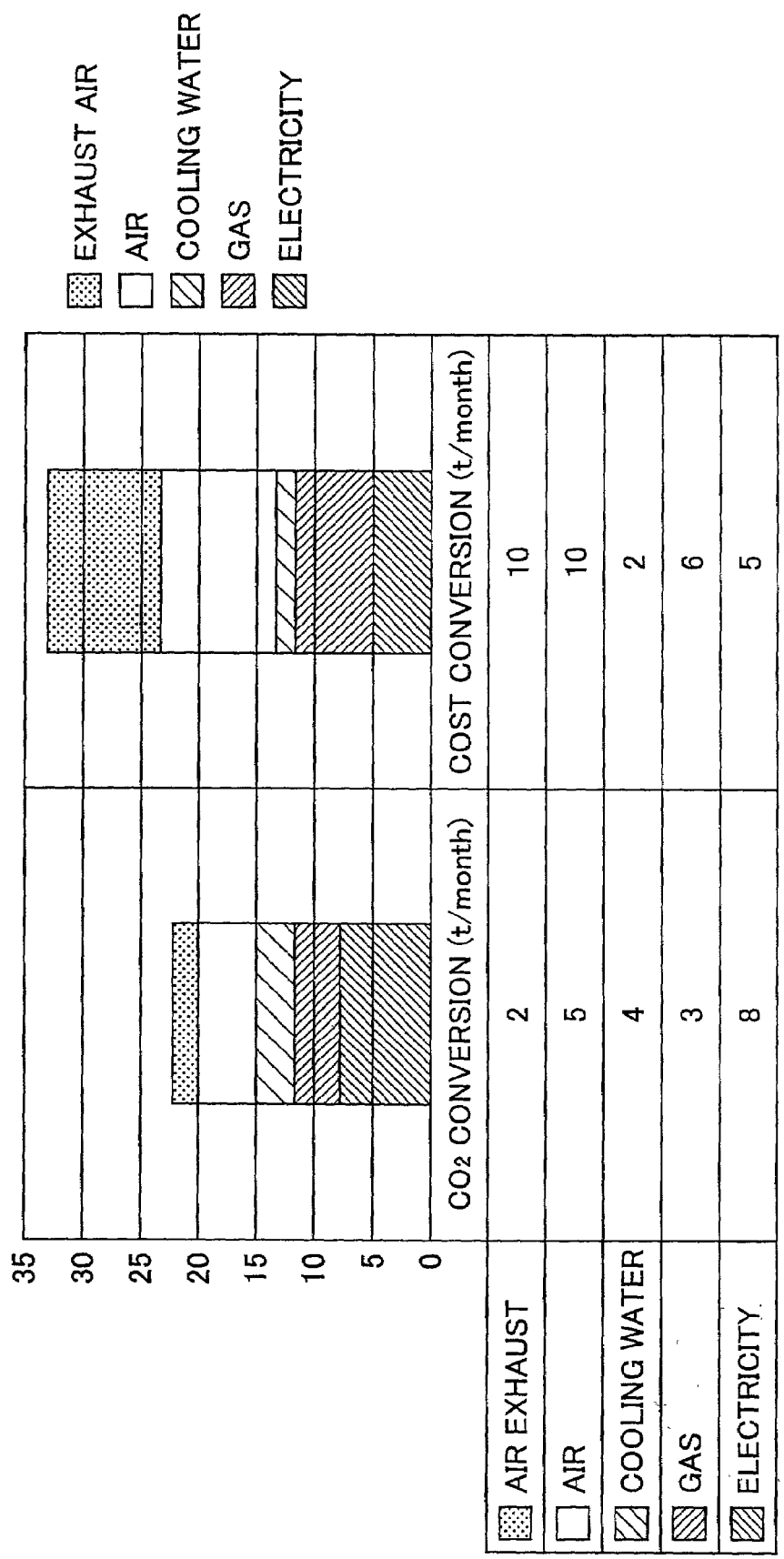
FIG. 14 is a graph showing sample costs and $C_2$ emission levels when operating the vertical heat treatment apparatus.

In this manner, the unit costs and the measured values read into the PC 6 are multiplied by the cost calculation program 94 as described above, with the cost for each item and the total cost displayed for example as in FIG. 14 by the display means 65. Additionally, costs are obtained in the same way for the auxiliary unit 4 also, and included in total cost. In FIG. 14, the "air exhaust" is the cost for the power consumption of the exhaust fans 31, 32, "air" is the cost for the dry coil 55 and the environmental control unit 5 for the purpose of introducing fresh air into the clean room as same is exhausted, "cooling water" is the cost of supplying cooling water to the furnace 2, "gas" is the cost of the N2 gas and the fuel gas for the purpose of processing the exhaust gas, and "power" is the cost of the power consumed by electrical equipment such as the heater 22 and the like.

Figure 15:
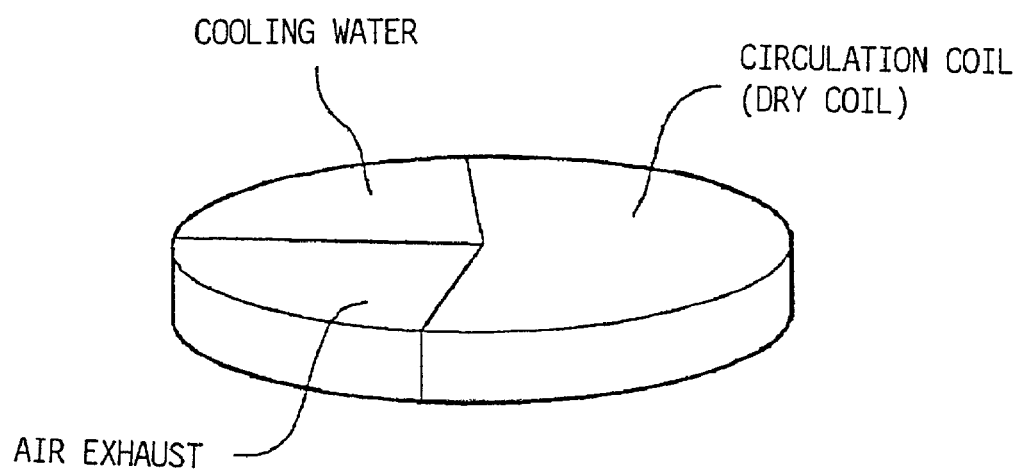
FIG. 15 is a graph showing sample costs when operating the vertical heat treatment apparatus.

Further and additionally, FIG. 15 shows one example of the cost of cooling of the cooling system (corresponding to an amount of heat processed Q3), the cost of cooling of the exhaust system (corresponding to an amount of heat processed Q2) and the cost of cooling of the exhaust system (corresponding to an amount of heat processed Q1).

Next, a description will be given of the capability to track the level of $CO_2$ (carbon dioxide) generated. This capability calculates a carbon dioxide emission conversion value for electricity by multiplying power consumption by a crude oil conversion coefficient, and calculates a carbon dioxide emission conversion value for amounts of power consumed when producing and/or processing things other than electricity, such as water, air, gas, and so forth, and further, calculates an amount of $CO_2$ generated when combusting gas. Amounts of $CO_2$ generated in total as well as for individual items are calculated by the $CO_2$ emission level calculation program based on measured values read into the PC 6 and are displayed as in FIG. 14, for example together with costs.

Values measured when obtaining the heat budget and costs may be used as the measured values for the purpose of calculating amounts of $CO_2$ (carbon dioxide) generated. Equations for obtaining amounts of $CO_2$ generated are given for each item below. In the following equations, $CO_2$ emission rate=0.2 (t/MWh)=0.0002 (t/kWh).

<1> Electricity
Measurement item: amount of power consumed (kWh)

> Amount of $CO_2$ generated (t) by electricity consumption=Amount of power consumed (kWh)×$CO_2$ emission rated (t/kWh)

<2> Gas 1) $N_2$, 2) Dry-Air , 3) LN gas, 4) Lp gas
1) $N_2$ (when supplied from an on-site facility)
Measurement item: Consumed $N_2$ volume ($m^3$)

> Amount of $CO_2$ generated (t) in consumption of $N_2$=Consumed $N_2$ volume ($m^3$)×amount of $CO_2$ generated per unit volume of $N_2$ (t/$m^3$)=Consumed $N_2$ volume ($m^3$)×{on-site plant power consumption (kWh/month)×$CO_2$ emission rate (t/kWh)÷standard production volume ($m^3$/month)}

2) Dry-Air
Measurement item: Consumed Dry-Air volume ($m^3$)

> Amount of $CO_2$ generated in Dry-Air consumption (t/$m^3$)=Consumed Dry-Air volume ($m^3$)×Dry-Air unit cost (yen/$m^3$)=Consumed Dry-Air volume ($m^3$)×compressor rated power (kWh/h)× $CO_2$ emission rated (t/kWh)÷Dry-Air standard production volume ($m^3$/h)}

3) Ln gas ($CH_4$)

> Measurement item: Consumed LN gas volume (L)=Consumed LN gas volume (L)÷22.4 (L)×44 (g/mol)÷1000000 (g/t)

4) LP gas (propane)
Measurement item: Consumed LP gas volume (L)

> Amount of $CO_2$ generated in LP gas consumption (t/$m^3$)=Consumed LN gas volume (L)÷22.4 (L)×44 (g/mol)×3÷1000000 (g/t)

<3> Distilled Water
1) Primary distilled water
Measurement item: Consumed primary distilled water volume (t): t=$m^3$ > Amount of $CO_2$ generated in consumption of primary distilled water (t)=Consumed primary distilled water (t/month)×{primary distilled water production facility power consumption (kWh/month)×$CO_2$ emission rate (t/kWh)÷standard primary distilled water production volume (t/month)}

2) Secondary Distilled Water
Measurement item: Consumed secondary distilled water volume (t)

> Amount of $CO_2$ generated in consumption of secondary distilled water (t)=Amount of $CO_2$ generated in consumption of primary distilled water (t)+consumed secondary distilled water (t/month)×secondary distilled water production facility power consumption (kWh/month)×$CO_2$ emission rate (t/kWh)÷standard secondary distilled water production volume (t/month)}

<4> Tap Water
Measurement item: Consumed tap water volume (t) or ($m^3$)

> Cost of tap water (yen)=Consumed tap water volume (t)×0.04 (kW/$m^3$/h)×$CO_2$ emission rate (t/kWh)

<5> Wastewater
1) Low-concentration wastewater
Measurement item: Low-concentration wastewater volume ($m^3$)

> amount of $CO_2$ low-concentration wastewater treatment=Low-concentration wastewater volume ($m^3$)×amount of $CO_2$ generated in treating a unit of low-concentration waste water (t/$m^3$) =Low-concentration wastewater volume ($m^3$)× wastewater treatment equipment power consumption (kWh/month)×$CO_2$ emission rate (t/kWh)÷standard wastewater treatment volume ($m^3$/month)}

<6> Cooling Water (Intake-exhaust Temperature Difference: $\Delta t$)
Measurement item: Consumed cooling water volume (m3)

> Amount of $CO_2$ generated in using cooling water (t)=Consumed cooling water volume ($m^3$)× amount of $CO_2$ generated per unit of cooling water (t/$m^3$)=Consumed cooling water volume ($m^3$)×[{$\Delta t$ (° C.)×circulation pump rated flow ($m^3$/month)÷0.86 (kcal/h·kWh)×cooler cooling efficiency (kWh/kWh)}+circulation pump rated power (kW)×24 (h)×30 (day)}×$CO_2$ emission rate (t/kWh)]÷circulation pump rated flow ($m^3$/month)=Consumed cooling water volume ($m^3$)× [{cooler power consumption for the cooling water (kWh/month)+circulation pump rated power (kWh/month)×$CO_2$ emission rate (t/kWh)]÷circulation pump rated flow ($m^3$/month)

<7> Air Exhaust
1) Exhaust system consisting only of an air-exhaust ventilator
Measurement item: Exhaust airflow ($m^3$/h)

> Amount of $CO_2$ generated in treating exhaust (t)=Exhaust airflow ($m^3$/h)×amount of $CO_2$ generated per unit volume of air exhaust (t/$m^3$/h) =Exhaust airflow ($m^3$/h)×[{environmental control unit fan rated power (kWh)×$CO_2$ emission rate (t/kWh)÷environmental control unit fan rated volume (m3/h)}+{exhaust fan rated power (kWh)×CO$_2$ emission rate (t/kWh)÷environmental control unit fan rated volume (m$^3$/h)}]

2) Exhaust system having a scrubber capability
Measurement item: Exhaust airflow (m$^3$/h)

Amount of CO$_2$ generated in treating air exhaust (t)=Exhaust airflow (m$^3$/h)×amount of CO$_2$ generated per unit volume of air exhaust (t/m$^3$/h) =Exhaust airflow (m$^3$/h)×[{environmental control unit fan rated power (kWh)×CO$_2$ emission rate (t/kWh)÷environmental control unit fan rated volume (m$^3$/h)}+{exhaust fan rated power (kWh)+circulation pump rated power (kWh)]× CO$_2$ emission rate (t/kWh)÷environmental control unit fan rated volume (m$^3$/h)}]

The CO$_2$ emission conversion factor expressed in the equations above is included in applications having the individual programs 91–95. When these applications are loaded in the PC 6, they are, for example, stored in the work memory 64. The amount of CO$_2$ generated per vertical heat treatment apparatus on a per-apparatus basis is obtained as the sum of <1> through <7> above.

By obtaining the amount of CO$_2$ generated and the operating cost per vertical heat treatment apparatus on a per-apparatus basis as with this embodiment, it is possible to discover the cause of large costs and high levels of CO$_2$ emissions and form effective information for perfecting countermeasures, and in particular in combination with the heat budget previously mentioned, can be a regime for optimizing the apparatus.

It should be noted that the present invention is not limited to carrying out power measurements, fluid measurements and heat amount measurements on just the equipment inside the clean room, but encompasses also cases in which similar measurements are carried out on some or all of any accessory equipment necessary for the semiconductor manufacturing apparatus (such as the auxiliary unit 4 of the first embodiment). Further, cases in which heat budgets, cost calculations and CO$_2$ emission levels are obtained for just the accessory equipment itself are also included. For example, cases in which heat budgets, cost calculations and CO$_2$ emission levels for removal equipment that is the exhaust gas treatment system are displayed are also included within the scope of the present invention.

Additionally, although a description has been given for a case in which the exhaust gas treatment system uses combustion of a fuel gas, the exhaust gas treatment system that is an accessory in the present invention is not limited to such but also includes, for example, adhesive column systems (which trap components in the exhaust gas with an adhesive agent), humidity systems (which use water vapor mist inside a wind tunnel to ionize components of the exhaust gas and dissolve them in water), catalytic systems (which contact the exhaust gas to a material that acts as a catalyst, thus dissolving components in the exhaust gas or converting them into other, harmless materials) or systems that treat using electricity.

Further and additionally, with respect to removal equipment for the treatment of exhaust gas, the components included in the exhaust gas treated and expelled from the exhaust gas treatment apparatus are analyzed by other measuring instruments (FT-IR etc.) and multiplied by a global warming potential (GWP) from that analysis and amount to calculate the amount of exhaust, which is included in the above calculations. The values that convert the effects of warming imparted to the earth into CO$_2$ are established by EIAJ (Electronic Instrument Association of Japan) depending on the component in question. Calculations are made using those conversion factors.

EXAMPLES

| $CF_4$ | 6500 | $C_4F_8$ | 8700 |
|---|---|---|---|
| $C_2F_6$ | 9200 | $CHF_3$ | 11700 |
| $NF_3$ | 9700 | $SF_6$ | 23900 |

As described above, the present invention can also be adapted to semiconductor manufacturing apparatuses other than vertical heat treatment apparatuses, such as coating and developing devices for forming resist patterns on semiconductor wafers and liquid crystal display substrates, for example, as well as to plasma processing devices that perform film formation and etching using plasma. In other apparatuses, there are certain types of processing units for preventing gases containing alkaline components and acid components from flowing into the housing or for exhausting the interior of the housing of the main unit, but in these cases as well, it is preferable to measure the amount of exhaust gas and from these determine the amount of power consumed in the same way as described above. Additionally, as already stated previously in the description of the cost calculation of the second embodiment, tap water and distilled water are sometimes used as the utility, and in this case it is possible to obtain the power consumption, costs and amounts of CO$_2$ generated in the same way by storing in memory the unit costs and the power consumption on a per-volume-unit for the manufacture or the processing of the water.

As described above, according to the present invention it is possible to track the heat budget for a semiconductor manufacturing apparatus and to obtain the optimum utilization of the facility. Additionally, by tracking operating costs and CO$_2$ emission levels, the present invention is useful in optimizing the operation of the facility and improving energy consumption of the apparatus.

The present invention is not limited to the particular embodiments described above, and variations and modifications may be made within the scope of the present invention.

What is claimed is:

1. A managing apparatus of a semiconductor manufacturing apparatus, comprising:
    power measuring means for measuring electrical power consumption of electrical equipment used in the semiconductor manufacturing apparatus;
    utility measuring means for measuring an amount of a utility fluid that is manufactured or processed;
    means for obtaining an amount of electric power consumed when manufacturing or processing the utility fluid based on values measured by the utility measuring means;
    energy consumption calculating means for adding together the electrical power consumption of the electrical equipment and the amount of electric power consumed when manufacturing or processing the utility fluid and obtaining energy consumption of the apparatuses used in semiconductor manufacturing on a per-unit basis;
    factor measuring means for measuring factors needed to obtain the amount of heat discharged from the equipment used in the apparatus used in semiconductor manufacturing;
    discharged heat amount calculating means for obtaining an amount of heat discharged on a per unit basis from the apparatus used in the semiconductor manufacturing based on values measured by the factor measuring means; and display means for displaying the amount of heat discharged as obtained by the discharged heat amount calculating means and displaying the energy consumption as obtained by the energy consumption calculating means.

2. The managing apparatus of claim 1, wherein the utility fluid is a temperature control fluid that controls the temperature of the equipment.

3. The managing apparatus of claim 1, wherein the utility fluid is air that flows through an interior of the apparatus used in semiconductor manufacturing.

4. The managing apparatus of claim 1, wherein the utility fluid is a gas used in the apparatus used in semiconductor manufacturing.

5. The managing apparatus of claim 1, wherein the utility fluid is water used in the apparatus used in semiconductor manufacturing.

6. The managing apparatus of claim 1, wherein the apparatus used in semiconductor manufacturing includes equipment contained within a housing provided inside a clean room, and the discharged heat includes heat discharged from the equipment into the clean room via an interior of the housing.

7. The managing apparatus of claim 6, wherein the factor measuring means includes:

a first temperature measuring means for measuring a temperature inside the housing;

a second temperature measuring means for measuring a temperature outside the housing; and means for obtaining an amount of heat discharged from inside the housing to outside the housing based on the measured temperatures inside the housing and outside the housing.

8. The managing apparatus as claimed in claim 7, comprising means for providing a plurality of measuring points measured by the first temperature measuring means and the second temperature measuring means, operating the apparatus used in the semiconductor manufacturing under a variety of conditions and tracking the temperature at each measuring point, establishing an interrelationship between certain measuring points and other measuring points and producing a calibration curve, and estimating measurements at other measuring points based on measurements at certain measuring points and on the calibration curve.

9. The managing apparatus as claimed in claim 7, wherein:

the factor measuring means includes wind speed measuring means for measuring a wind speed inside the housing and a wind speed outside the housing; and wind speed measurements are included in a equation for obtaining the amount of heat discharged from inside the housing to outside the housing.

10. The managing apparatus as claimed in claim 6, wherein the apparatus used in semiconductor manufacturing includes:

an exhaust path for exhausting the inside of the housing and removing the heat from inside the housing to outside the clean room; and the amount of heat discharged includes heat removed through the exhaust path by a gas exhausted from the exhaust system.

11. The managing apparatus as claimed in claim 10, wherein the factor measuring means includes:

exhaust path temperature measuring means for measuring a temperature inside the exhaust path;

exhaust path wind speed measuring means for measuring wind speed inside the exhaust path; and means for obtaining an amount of heat discharged by the gas exhausted through the exhaust path based on measurement results obtained by the exhaust path temperature measuring means and the exhaust path wind speed measuring means, a cross-sectional surface area of the exhaust path and the temperature inside the clean room.

12. The managing apparatus of claim 1, wherein the apparatus used in the semiconductor manufacturing includes equipment cooled by a cooling fluid that flows along a flow path and the amount of heat discharged includes an amount of heat removed by the cooling fluid.

13. The apparatus of claim 12, wherein the factor measuring means includes flow measuring means for measuring a flow of the cooling fluid and the apparatus obtains a heat amount removed by the cooling fluid based on flow measurements and a difference in temperature between the cooling fluid on the intake side of the equipment and the cooling fluid on the exhaust side.

14. The managing apparatus of claim 13, comprising:

a computer that includes the discharged heat amount calculating means, the energy consumption calculating means and the display means; and a signal conversion unit for converting measurement results of the factor measuring means to signals that can be processed by the computer.

15. The managing apparatus as claimed in claim 14, wherein the computer and the signal conversion unit are provided on a cart.

16. The managing apparatus as claimed in claim 14, including the factor measuring means detachably attached to the measuring point and further connected via wiring to the signal conversion unit.

17. The managing apparatus as claimed in claim 14, including the factor measuring means that cannot be detached from the measuring point, the factor measuring means being connectable to as well as detachable from the signal conversion unit by wiring.

18. The managing apparatus as claimed in claim 1, comprising:

operating cost measuring means for measuring measurement items related to an operating cost of the apparatus used in semiconductor manufacturing; and means for performing calculations using measurement results from the operating cost measuring means and a cost conversion factor calculated from numerical values corresponding to those measurement items and obtaining per-unit cost of the apparatus used in the semiconductor manufacturing apparatus as a sum total of the results of the calculations, the managing apparatus displaying the per-unit operating costs of the apparatus used in the semiconductor manufacturing at the display means.

19. The managing apparatus of claim 18, wherein:

the operating cost measuring means utilizes the measuring means used when obtaining the amount of heat discharged and the energy consumption on a per-unit basis of the apparatuses used in semiconductor manufacturing; and the measurement results from the operating cost measuring means include the power consumption of the electrical equipment and an amount of power consumed when manufacturing or processing the utility fluid, the cost conversion factor corresponding to the power consumption being the power consumption unit cost.

20. The managing apparatus of claim 18, wherein the semiconductor manufacturing apparatus comprises the equipment contained within the housing provided inside the clean room, the exhaust path for exhausting the inside of the housing and removing such exhaust outside of the clean room, and an exhaust fan provided on the exhaust path, the operating cost measuring means being a means for measuring the exhaust gas air flow of the exhaust system, the cost conversion factor corresponding to the exhaust gas air flow being a cost per unit of air flow and a cost per unit of exhaust fan exhaust air flow of relevant systems equipment including an outside air processor when taking outside air into the clean room via the outside air processor.

21. The managing apparatus as claimed in claim 18, wherein the apparatus used in the semiconductor manufacturing has equipment cooled by the cooling fluid that flows along the flow path, and the operating cost includes a cooling cost obtained by performing calculations using the amount of heat discharged from the equipment to the cooling water and the unit cost of cooling the cooling water.

22. The managing apparatus of claim 18, wherein the apparatus used in the semiconductor manufacturing comprises equipment contained within the housing provided in the clean room and an exhaust system that exhausts the inside of the housing and cools the heat inside the housing, and the operating cost includes a cooling cost obtained by performing calculations using the amount of heat discharged to the exhaust system and the unit cost of cooling with the exhaust system.

23. The managing apparatus of claim 18, wherein the apparatus used in the semiconductor manufacturing comprises equipment contained in the housing provided inside the clean room, and the operating cost includes a cooling cost obtained by performing calculations using the amount of heat discharged from the equipment to the clean room via the inside of the housing and the unit cost of cooling with a cooling system that cools circulatory air inside the clean room.

24. The managing apparatus of any of claims 1 through 23, comprising:

carbon dioxide emission measuring means for measuring measurement items relating to carbon dioxide emissions converted for the apparatuses used in semiconductor manufacturing; and means for performing calculations using measurement results from the carbon dioxide emission measuring means and carbon dioxide emission conversion factors corresponding to those measurement items and obtaining a per-unit carbon dioxide emission level for the apparatus used in the semiconductor manufacturing apparatus as a sum total of the results of the calculations, displaying the per-unit carbon dioxide emission level for the apparatus used in the semiconductor manufacturing so obtained at the display means.

25. The managing apparatus of claim 24, wherein the measurement result includes power consumption of the electrical equipment measured when obtaining power consumption on a per-unit basis for the apparatus used in the semiconductor manufacturing and an amount of power consumed when manufacturing or processing the utility fluid, and the carbon dioxide emission conversion factor used for calculating with these power consumptions is a crude oil equivalent coefficient that indicates an amount of carbon dioxide generated when producing a unit of electrical power.

26. The managing apparatus of claim 24, wherein the apparatus used in semiconductor manufacturing includes:

equipment contained in the housing provided in the clean room; and means for obtaining power consumption consumed by the clean room cooling system that corresponds to an amount of heat discharged into the clean room from the equipment via the inside of the housing and including a generated amount of carbon dioxide converted by multiplying the power consumption by the crude oil equivalent coefficient in an amount of carbon dioxide generated on a per-unit basis for the apparatus used in the semiconductor manufacturing.

27. The managing apparatus of claim 26, including:

temperature measuring means for measuring the temperature inside the housing, temperature measuring means for measuring means for measuring the temperature outside the housing, and means for obtaining the amount of heat discharged from inside the housing to outside the housing based on the temperatures inside the housing and outside the housing, and further having means for setting a plurality of measuring points to be measured by the temperature measuring means, operating the apparatus used in the semiconductor manufacturing under a variety of conditions and tracking the temperature state at each measuring point, establishing an interrelationship between certain measuring points and other measuring points and producing a calibration curve, estimating measurements at other measuring points based on measurements at certain measuring points and on the calibration curve, and obtaining an energy consumption consumed by the cooling system that corresponds to the amount of heat discharged into the clean room using the estimated temperature values.

28. The managing apparatus of claim 24, comprising:

fuel gas consumption measuring means for measuring an amount of fuel gas consumed in the combustion of exhaust gas exhausted from the apparatus used in the semiconductor manufacturing;

carbon dioxide emission measuring means for multiplying the measurements by an amount of carbon dioxide generated for combusting fuel gas on a per-unit basis and obtaining an amount of carbon dioxide generated; and means for including the carbon dioxide emissions obtained by the carbon dioxide emission measuring means in the amount of carbon dioxide generated on a per-unit basis for the apparatus used in semiconductor manufacturing.

29. A method of managing a semiconductor manufacturing apparatus, including:

measuring power consumption of electrical equipment used in the semiconductor manufacturing apparatus;

measuring an amount of a fluid that is manufactured or processed and obtaining an amount of power consumed when manufacturing or processing the utility fluid based on the measured value;

adding the electrical equipment power consumption and the amount of power consumed when manufacturing or processing the utility fluid based on the measured value and obtaining energy consumption on a per-unit basis for the apparatus used in the semiconductor manufacturing;

measuring factors needed to obtain an amount of heat discharged from the equipment used in the semiconductor manufacturing apparatus and obtaining an amount of heat discharged on a per-unit basis for the semiconductor manufacturing apparatus based on the measurements; and displaying the energy consumption and the amount of heat discharged on a per-unit basis for the semiconductor manufacturing apparatus.

30. The method of managing a semiconductor manufacturing apparatus of claim 29, wherein:

the semiconductor manufacturing apparatus includes equipment contained within a housing provided inside a clean room, an exhaust path for exhausting an interior of the housing and removing heat from the interior of the housing to outside the clean room, and equipment that is cooled by a cooling fluid that flows along a flow path; and the amount of heat discharged includes an amount of heat discharged from the equipment contained inside the housing to the clean room via the inside of the housing, an amount of heat removed by a gas exhausted from the exhaust path, and an amount of heat removed by the cooling fluid.

31. The method of claim 29, including:

measuring a measurement item related to an operating cost of the apparatus used in semiconductor manufacturing, performing calculations using those measurement results and a cost conversion factor calculated from numerical values corresponding to the measurement items, obtaining a per-unit cost of the apparatus used in the semiconductor manufacturing as a sum total of the results of the calculations, and displaying the cost on a display means.

32. The managing method of any one of claims 29 through 31, including:

measuring measurement items related to a converted carbon dioxide emission level for the apparatus used in the semiconductor manufacturing;

performing calculations using the measurement results obtained in the preceding step and a carbon dioxide emission level conversion factor corresponding to those measurement items, and obtaining a per-unit carbon dioxide emission level of the apparatus used in the semiconductor manufacturing as a sum total of the results of the calculations; and displaying the results obtained in the preceding step on the display means.

* * * * *